United States Patent
Ichikawa et al.

(10) Patent No.: US 8,471,413 B2
(45) Date of Patent: Jun. 25, 2013

(54) CONTROL DEVICE OF POWER SUPPLY CIRCUIT

(71) Applicants: Shinji Ichikawa, Toyota (JP); Kazuyoshi Obayashi, Chita-gun (JP)

(72) Inventors: Shinji Ichikawa, Toyota (JP); Kazuyoshi Obayashi, Chita-gun (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 13/714,538

(22) Filed: Dec. 14, 2012

(65) Prior Publication Data

US 2013/0099594 A1    Apr. 25, 2013

Related U.S. Application Data

(62) Division of application No. 12/311,865, filed as application No. PCT/JP2007/072607 on Nov. 15, 2007, now Pat. No. 8,344,555.

(30) Foreign Application Priority Data

Nov. 20, 2006  (JP) ................................. 2006-312752
Jan. 31, 2007   (JP) ................................. 2007-021575

(51) Int. Cl.
   *H02H 7/00*      (2006.01)
(52) U.S. Cl.
   USPC ........................... 307/115; 307/9.1; 307/10.1
(58) Field of Classification Search
   USPC .......................................... 307/9.1, 10.1, 115
   See application file for complete search history.

(56) References Cited

U.S. PATENT DOCUMENTS

| | | | |
|---|---|---|---|
| 5,373,195 | A | 12/1994 | De Doncker et al. |
| 6,828,798 | B2 | 12/2004 | Morimoto |
| 7,019,488 | B2 | 3/2006 | Nakao |
| 7,095,191 | B2 | 8/2006 | Sakurai |
| 7,242,196 | B2 | 7/2007 | Yudahira et al. |
| 7,368,829 | B2 | 5/2008 | Tezuka |
| 7,573,150 | B2 | 8/2009 | Hirasawa |
| 7,608,940 | B2 | 10/2009 | Osawa |
| 7,688,606 | B2 | 3/2010 | Amano |
| 7,816,804 | B2 | 10/2010 | Soma et al. |
| 7,898,103 | B2 | 3/2011 | Oyobe et al. |
| 2002/0070608 | A1 | 6/2002 | Matsuki et al. |
| 2010/0038962 | A1 | 2/2010 | Komatsu |
| 2010/0045104 | A1 | 2/2010 | Hirasawa |
| 2010/0244558 | A1 | 9/2010 | Mitsutani et al. |

FOREIGN PATENT DOCUMENTS

| | | |
|---|---|---|
| JP | A-06-276609 | 9/1994 |
| JP | A-09-233710 | 9/1997 |
| JP | A-09-284998 | 10/1997 |
| JP | A-2002-010502 | 1/2002 |
| JP | A-2003-319671 | 11/2003 |
| JP | A-2005-056728 | 3/2005 |
| JP | A-2005-245049 | 9/2005 |
| JP | A-2005-276565 | 10/2005 |
| WO | WO 2006/121144 A1 | 11/2006 |

OTHER PUBLICATIONS

Mar. 11, 2013 Notice of Allowance issued in U.S. Appl. No. 13/715,042.

*Primary Examiner* — Adi Amrany
(74) *Attorney, Agent, or Firm* — Oliff & Berridge, PLC

(57) ABSTRACT

An ECU executes a program including a step of turning on an SMRP and an A-SMRP if an ignition switch is turned on; a step of detecting voltage values VB(1) and VB(2) of running batteries when VH is detected and if VH is higher than 180 V; a step of detecting that SMRP connected to the running battery is welded, if VB(1) is higher than 150 V; and a step of detecting that A-SMRB connected to the running battery is welded, if VB(2) is higher than 150 V.

4 Claims, 11 Drawing Sheets

CONTROL DEVICE OF POWER SUPPLY CIRCUIT

This is a Division of application Ser. No. 12/311,865 filed Apr. 16, 2009, which in turn is a National Phase of PCT/JP2007/072607 filed Nov. 15, 2007, which claims the benefit of Japanese Application Nos. 2006-312752 filed Nov. 20, 2006 and 2007-021575 filed Jan. 31, 2007. The disclosure of the prior applications is hereby incorporated by reference herein in their entirety.

TECHNICAL FIELD

The present invention relates to a power supply circuit of a vehicle having a motor for running mounted thereon, such as an electric vehicle, a fuel cell vehicle or a hybrid vehicle, and more particularly to a technique to detect abnormality of a power supply circuit that connects and disconnects a power storage mechanism (storage batteries (batteries, secondary batteries), capacitors and the like) to a load.

BACKGROUND ART

A hybrid vehicle including a motor that operates with electric energy as well as an engine that operates with combustion energy as driving force sources of running of a vehicle has conventionally been known. This hybrid vehicle mainly includes the following types: (1) a series hybrid system in which an engine operates as a power supply source when the engine drives wheels without a motor; and (2) a parallel hybrid system in which wheels are driven by both an engine and a motor. Further, there is another type called a parallel-series hybrid system having both these functions.

Except for the series hybrid system, a motor is used as an auxiliary driving source that assists an engine in outputting. Such a hybrid vehicle performs various kinds of control, such as assistance of a motor to an engine in outputting when the vehicle is accelerating, and charging a battery and the like by deceleration regeneration when the vehicle is decelerating. This can satisfy demands of a driver while securing the residual capacity of a battery. Such a hybrid vehicle includes a power drive unit (referred to also as a "PCU (power control unit)") for the purpose of drive or regeneration of a motor. The power drive unit includes a plurality of switching elements, and drives a motor or performs regeneration of a motor by current control using the switching elements. The hybrid vehicle further includes a motor control device that outputs a control signal causing the switching elements to perform switching.

A battery that stores electric power supplied to a motor is mounted on the foregoing hybrid vehicle. The motor is connected to an inverter. The inverter is connected to the battery. Provided between the inverter and the battery is an SMR (system main relay) that electrically connects and disconnects the inverter with the battery. The SMR includes a positive SMR provided on the positive electrode of a battery, a negative SMR provided on the negative electrode of a battery, and a precharge SMR that is connected in parallel to the positive SMR and to which a resistor is connected in series. A large-capacity electrolytic capacitor is provided between terminals on an input side of the inverter so as to smooth the fluctuation of voltage to stabilize operation of the inverter. When a hybrid vehicle runs, the capacitor is charged with the main SMRs closed (with the positive SMR and the negative SMR closed) by operating an ignition switch. However, if the capacitor is charged directly by a battery, a large amount of current may flow to cause damage to contacts of SMRs. To address this disadvantage, first, the precharge SMR is closed and the capacitor is precharged until a certain time has elapsed while a current is limited by a limiting resistor or the like. After precharging is finished, the main SMRs are closed. Contacts of SMRs are thus prevented from damage.

Further, electric power may be supplied to an electric load by using a plurality of batteries, and a plurality of batteries may also be charged, which is not limited to the foregoing hybrid vehicle. Even in such cases, the foregoing precharging is needed. Japanese Patent Laying-Open No. 2002-10502 discloses a charge and discharge device for storage batteries that concurrently performs charging and discharging although the device is not limited to one for vehicles. The charge and discharge device for storage batteries includes a switching element to which an ac voltage is inputted and that controls the output, a smoothing capacitor that smoothes the output and applies the smoothed ac voltage to a storage battery, a first voltage detector that detects a voltage across the smoothing capacitor, a second voltage detector that detects a storage battery voltage of the storage battery, and a control device that causes the switching element to control so that a detection signal of the first voltage detector becomes a detection signal of the second voltage detector.

With this charge and discharge device for storage batteries, if there is a difference between a voltage across the smoothing capacitor and a storage battery voltage of the storage battery, the voltage across the capacitor is detected by the first voltage detector and the storage battery voltage of the storage battery is detected by the second voltage detector. Control of the switching element is performed by the control device so that the detection signal of the first voltage detector becomes the detected voltage of the second voltage detector. This eliminates the difference between the voltage across the smoothing capacitor and the storage battery voltage of the storage battery. Charging from the storage battery to the capacitor is thus gradually performed. No excessive current flows.

However, although the foregoing charge and discharge device for storage batteries disclosed in Japanese Patent Laying-Open No. 2002-10502 includes a plurality of storage batteries and includes a plurality of opening/closing means (relay) to suppress occurrence of an excessive current, there is no mention of detecting abnormality (immobility in which an opening/closing operation does not work, fixation (welding) in which a unit remains in the closed state and is not changed to the open state) of the opening/closing means.

In a case of having a plurality of power storage mechanisms and using (charging and discharging) the power storage mechanisms with switchover among them or simultaneously, a plurality of relays are needed. It is very important for hybrid vehicles to detect what relay is abnormal among a plurality of relays and what is the abnormality like.

DISCLOSURE OF THE INVENTION

The present invention is directed to solve the forgoing problems. An object of the present invention is to provide a control device of power supply circuits capable of accurately detecting abnormality of relays in power supply circuits having a plurality of power storage mechanisms. Another object of the present invention is to provide a control device of power supply circuits capable of accurately detecting, for a short time, abnormality of relays in power supply circuits having a plurality of power storage mechanisms.

A control device for power supply circuits according to the present invention controls a plurality of power supply circuits including power storage mechanisms and a plurality of relays. Each of the power supply circuits includes a circuit that has a first relay controlling electric conduction/non-conduction between a load and one electrode of the power storage mechanism and a resistor connected in series to the first relay, a second relay connected in parallel to the circuit, and a third relay controlling electric conduction/non-conduction between the load and another electrode of the power storage mechanism. The control device includes: a voltage detection unit detecting a voltage value of the load; a voltage detection unit detecting a voltage value of each of the power storage mechanisms; a processing unit performing a precharge process upon power supply startup, the precharge process being performed by causing a conductive state of the first relay and the third relay before causing the conductive state of the second relay and the third relay in each of the power supply circuits; and a detection unit detecting, before performing the precharge process, based on a voltage value of the load and a voltage value of each of the power storage mechanisms detected when outputting a conduction command to the relay on one electrode of the power storage mechanism in each of the power supply circuits, welding of the relay on another electrode in any power supply circuit of the plurality of power supply circuits.

According to this invention, one power supply circuit is formed of a power storage mechanism whose voltage value is detectable and a plurality of (three) relays. A control device controls the plurality of power supply circuits. Before precharging (all three relays are turned off and in a non-conductive state), a conduction command is outputted only to a relay on one electrode (e.g., negative electrode) of the power storage mechanism in each power supply circuit. Assuming that the relay on the negative electrode is normal, if a relay on the positive electrode is also normal, the power supply circuit and a load do not constitute a closed circuit. The voltage value of the load therefore does not increase. However, if the voltage value of the load increases, it can be determined that a relay on the other electrode (e.g., positive electrode) of any of power supply circuits is welded and is conductive. In this case, to identify what power supply circuit includes the relay, which is welded, on the positive electrode, determination is performed based on the voltage value of the power storage mechanism of each power supply circuit. That is, it can be determined that a relay on the positive electrode of a power supply circuit that includes a power storage mechanism having a high voltage value is welded. This makes it possible to detect what relay in the plurality of power supply circuits is welded. As a result, it is possible to provide a control device of power supply circuits capable of accurately detecting abnormality of relays in power supply circuits having a plurality of power storage mechanisms. Note that such an abnormality detection process (a process of detecting abnormality by outputting a conduction command only to a relay on one electrode of a power storage mechanism in each power supply circuit before precharging) is performed simultaneously to all power supply circuits, enabling processing time to be reduced (compared to a case of individually performing the process for each power supply circuit).

It is preferable that based on a voltage value of the load and a voltage value of each of the power storage mechanisms detected when the conduction command is outputted to the first relay in each of the power supply circuits, the detection unit detects welding of the third relay in any power supply circuit of the plurality of power supply circuits.

According to this invention, based on a fact that the voltage value of the load increases although a conduction command is outputted only to the first relay of each power supply circuit, it can be determined that a closed circuit is formed between at least one power supply circuit and the load. There is a possibility of welding of the third relay of any one or all of the plurality of power supply circuits. By detecting the voltage value of a power storage mechanism, it can be determined that the third relay of a power supply circuit in which the voltage value is high is welded. Thus, what relay of the plurality of power supply circuits is welded can be detected.

It is further preferable that based on a voltage value of the load and a voltage value of each of the power storage mechanisms detected when the conduction command is outputted to the third relay in each of the power supply circuits, the detection unit detects welding of the first relay in any power supply circuit of the plurality of power supply circuits.

According to this invention, based on a fact that the voltage value of the load increases although a conduction command is outputted only to the third relay of each power supply circuit, it can be determined that a closed circuit is formed between at least one power supply circuit and the load. There is a possibility of welding of the first relay of any one or all of the plurality of power supply circuits. By detecting the voltage value of a power storage mechanism, it can be determined that the first relay of a power supply circuit in which the voltage value is high is welded. Thus, what relay of the plurality of power supply circuits is welded can be detected.

It is further preferable that the detection unit detects welding of the relay of the power supply circuit in which the detected voltage value of the load is higher than a voltage value determined in advance and the voltage value of the power storage mechanism is higher than a voltage value separately determined in advance.

According to this invention, based on a fact that the voltage value of the load increases although a conduction command is outputted to only the first relay or only the third relay of each power supply circuit, it can be determined that a closed circuit is formed between the power supply circuit and the load. There is a possibility of welding of the third relay of any one or all of the plurality of power supply circuits (in a case of assuming that a conduction command is given only to the first relay and the first relay is normal) or welding of the first relay of any one or all of the plurality of power supply circuits (in a case of assuming that a conduction command is given only to the third relay and the third relay is normal). By detecting the voltage value of a power storage mechanism, it can be determined that the third relay or the first relay of a power supply circuit in which the voltage value is high is welded. Thus, what relay of the plurality of power supply circuits is welded can be detected.

A control device for power supply circuits according to another aspect of the present invention controls the foregoing power supply circuits. The control device includes: a voltage detection unit detecting a voltage value of the load; a voltage detection unit detecting a voltage value of each of the power storage mechanisms; a processing unit performing a precharge process upon power supply startup, the precharge process being performed by causing a conductive state of the first relay and the third relay before causing the conductive state of the second relay and the third relay in each of the power supply circuits; and a detection unit detecting immobility of any of the first relay and the third relay in any power supply circuit of the plurality of power supply circuits, based on a voltage value of the load and a voltage value of each of the power storage mechanisms detected during the precharge process.

According to this invention, during precharging, a conduction command is outputted to the first relay and the third relay. For example, if the first relay is normal and the third relay is also normal, the power supply circuit and the load constitute a closed circuit. The voltage value of the load increases.

However, if there is no increase of the voltage value of the load (for example, assuming that the first relay is normal), it can be determined that the third relays of all power supply circuits are welded and not conductive. Further, even if the voltage value of the load increases, it can also be determined that the third relay of any power supply circuit is immobile and not conductive. That is, to identify what power supply circuit includes the third relay that is immobile, determination is performed based on the voltage value of the power storage mechanism of each power supply circuit. It can be determined that the third relay of a power supply circuit that includes a power storage mechanism in which the voltage value is low (in other words, a closed circuit is not formed) is immobile. This makes it possible to detect what relay in a plurality of power supply circuits is immobile. As a result, it is possible to provide a control device of power supply circuits capable of accurately detecting abnormality of relays in power supply circuits having a plurality of power storage mechanisms. Note that such an abnormality detection process (a process of detecting abnormality during precharging) is performed simultaneously to all power supply circuits, enabling system startup time to be reduced (compared to the case of individually performing the process for each power supply circuit).

It is preferable that based on a voltage value of the load and a voltage value of each of the power storage mechanisms, the detection unit detects immobility of the third relay in any power supply circuit of the plurality of power supply circuits.

According to this invention, during precharging, a conduction command is outputted to the first relay and the third relay. If the first relay is normal and one of the third relays is normal, the power supply circuit and the load constitute a closed circuit. The voltage value of the load increases. However, if all third relays are not normal although the first relay is normal, the power supply circuit and the load cannot constitute a closed circuit. There is therefore no increase of the voltage value of the load. In this case, it can be determined that the third relays of all power supply circuits are immobile and not conductive. On the other hand, even if the voltage value of the load increases, it can be determined that the third relay of a power supply circuit that includes a power storage mechanism in which the voltage value is low (in other words, a closed circuit is not formed) is immobile. This makes it possible to detect what relay in a plurality of power supply circuits is immobile.

It is further preferable that the detection unit detects immobility of the third relay of every power supply circuit when the detected voltage value of the load is not higher than a voltage value determined in advance.

According to this invention, during precharging, a conduction command is outputted to the first relay and the third relay. If the first relay is normal and one of the third relays is normal, the power supply circuit and the load constitute a closed circuit. The voltage value of the load increases. However, if all third relays are not normal although the first relay is normal, the power supply circuit and the load cannot constitute a closed circuit. There is therefore no increase of the voltage value of the load. In this case, it can be determined that third relays of all power supply circuits are immobile and are not conductive.

It is further preferable that the detection unit detects immobility of the third relay of the power supply circuit in which the detected voltage value of the load is higher than a voltage value determined in advance and the voltage value of the power storage mechanism is not higher than a voltage value separately determined in advance.

According to this invention, during precharging, a conduction command is outputted to the first relay and the third relay. If the first relay is normal and one of the third relays is normal, the power supply circuit and the load constitute a closed circuit. The voltage value of the load increases. Even if the voltage value of the load increases, it can be determined that the third relay of a power supply circuit that includes a power storage mechanism in which the voltage value is low (in other words, a closed circuit is not formed) is immobile. This makes it possible to detect what relay in a plurality of power supply circuits is immobile.

A control device for power supply circuits according to further another aspect of the present invention controls the foregoing power supply circuits. The control device includes: a voltage detection unit detecting a voltage value of the load; a current detection unit detecting a current value of each of the power storage mechanisms; a processing unit performing a precharge process upon power supply startup, the precharge process being performed by causing a conductive state of the first relay and the third relay before causing the conductive state of the second relay and the third relay in each of the power supply circuits; and a detection unit detecting, upon shutdown of power supply, based on drop of the voltage value of the load and a current value of each of the power storage mechanisms detected when outputting a non-conduction command to the relay on one electrode of the power storage mechanism in each of the power supply circuits, welding of the relay on the one electrode in any power supply circuit of the plurality of power supply circuits.

According to this invention, upon shutdown of power supply, for example, a non-conduction command is outputted to the second relay and the third relay. For example, if the non-conduction command is outputted to the second relay and the second relay is normal (not welded), a power supply circuit and the load are switched from a closed circuit to an open circuit. Power supply from the power supply circuit to the load is interrupted, and the voltage of the load drops. However, since the voltage value of the load does not normally drop, it can be determined that power is supplied from any power supply circuit to the load, that is, the second relay of at least one power supply circuit is welded and is conductive. To identify what power supply circuit includes the relay that is welded, determination is performed based on the value of a current flowing in the power storage mechanism of each power supply circuit. It can be determined that the third relay of a power supply circuit that includes a power storage mechanism in which a current having a high value flows is welded. This makes it possible to detect what relay in the plurality of power supply circuits is welded. As a result, it is possible to provide a control device of power supply circuits capable of accurately detecting abnormality of relays in power supply circuits having a plurality of power storage mechanisms. Note that regarding such an abnormality detection process (a process of detecting abnormality upon discharging) discharging is performed simultaneously to all power supply circuits, enabling system shutdown time to be reduced (compared to the case of individually performing the process for each power supply circuit).

It is preferable that the detection unit detects welding of the second relay in any power supply circuit of the plurality of power supply circuits, based on drop of a voltage value of the load and a current value of each of the power storage mechanisms detected when outputting the non-conduction command to the second relay of the power storage mechanism in each of the power supply circuits.

According to this invention, upon shutdown of power supply, a non-conduction command is outputted to the second relay. For example, if the second relay is not normal (is welded), the power supply circuit and the load are in a state of being connected. Power supply from the power supply circuit to the load is not interrupted, and therefore the voltage of the load does not drop. Further, to identify what power supply circuit includes the second relay that is welded, determination is performed based on the value of a current flowing in the power storage mechanism of each power supply circuit. That is, it can be determined that the second relay of a power supply circuit that includes a power storage mechanism in which a current having a high value flows is welded. This makes it possible to detect what second relay in the plurality of power supply circuits is welded.

It is further preferable that the detection unit detects welding of the third relay in any power supply circuit of the plurality of power supply circuits, based on drop of a voltage value of the load and a current value of each of the power storage mechanisms detected when outputting the non-conduction command to the third relay of the power storage mechanism in each of the power supply circuits.

According to this invention, upon shutdown of power supply, a non-conduction command is outputted to the third relay. For example, if the third relay is not normal (is welded), the power supply circuit and the load are in a state of being connected. Power supply from the power supply circuit to the load is not interrupted, and therefore the voltage of the load does not drop. Further, to identify what power supply circuit includes the third relay that is welded, determination is performed based on the value of a current flowing in the power storage mechanism of each power supply circuit. That is, it can be determined that the third relay of a power supply circuit that includes a power storage mechanism in which a current having a high value flows is welded. This makes it possible to detect what third relay in the plurality of power supply circuits is welded.

It is further preferable that the detection unit detects welding of the relay of the power supply circuit in which drop of the voltage value of the load is not normal and the current value of the power storage mechanism is higher than a current value determined in advance.

According to this invention, upon shutdown of power supply, a non-conduction command is outputted to the second relay or the third relay. For example, if the second relay or the third relay is not normal (is welded), the power supply circuit and the load are in a state of being connected. Power supply from the power supply circuit to the load is not interrupted, and therefore the voltage of the load does not drop. Further, to identify what power supply circuit includes the second relay or the third relay that is welded, determination is performed based on the value of a current flowing in the power storage mechanism of each power supply circuit. That is, it can be determined that the second relay or the third relay of a power supply circuit that includes a power storage mechanism in which a current having a high value flows is welded to form a closed circuit to allow a current to flow. This makes it possible to detect what the second relay or the third relay in the plurality of power supply circuits is welded.

A control device for power supply circuits according to further another aspect of the present invention controls the foregoing power supply circuits. The control device includes: a voltage detection unit detecting a voltage value of the load; a processing unit performing a precharge process, upon power supply startup, by causing a conductive state of the first relay and the third relay before causing the conductive state of the second relay and the third relay in each of the power supply circuits, so that a capacitor provided in parallel to the load and being an object of the precharge process is charged up to a charging level in such a level that a failure does not occur in the power supply circuit when electric power is supplied not through the resistor, and that the charging level is lower than full charging; a full-charge processing unit fully charging the capacitor, after performing the precharge process, with the charging rate of the capacitor from the charging rate lower than full charging to full charging divided, by sequentially using the second relay and the third relay in each of the power supply circuits; and a detection unit detecting immobility of any of the second relay and the third relay in each of the plurality of power supply circuits, before the capacitor is fully charged, based on at least one of the detected voltage value of the load and the charging rate of the capacitor.

According to this invention, when the charging rate reaches such a level (e.g., 80%) that a failure does not occur in a power supply circuit when electric power is supplied not through a limiting resistor, precharging finishes. After performing this precharge process, the second relay and the third relay are provided in a conductive state not through a limiting resistor in each power supply circuit, the charging rate of the capacitor from 80% to 100% is divided, and electric power is supplied from any power supply circuit (the power supply circuit being an object of failure detection) to charge the capacitor. For example, if the second relay is normal and the third relay is also normal, a closed circuit is formed between the power supply circuit and the load. The voltage value of the load increases, and the charging rate of the capacitor also increases. However, if the voltage value of the load does not increase, and the charging rate of the capacitor also does not increase (for example, assuming that the third relay is normal), it can be determined that the second relay of the power supply circuit being an object of failure detection is immobile and is not conductive. Further, to detect a failure of the third relay of another power supply circuit, the charging rate of the capacitor is divided. The capacitor is therefore not in the full charge state even when the failure detection of the first power supply circuit is finished. Therefore, without discharging the capacitor, the conductive state of the second relay and the third relay in the second power supply circuit is further caused, thereby enabling immobility of the third relay (which may be replaced by the second relay) to be detected. In this way, after precharging, the charging rate of the capacitor is divided corresponding to the number of power supply circuits (equal to the number of detecting abnormality of relays), so that the failure of relays in the plurality of power supply circuits can be detected before the capacitor is fully charged (a charging rate of 100%) one time. As a result, it is possible to provide a control device of power supply circuits capable of accurately detecting abnormality of relays in power supply circuits having a plurality of power storage mechanisms during one precharging.

It is preferable that the full-charge processing unit performs a full-charge process, with division performed corresponding to a number of the plurality of power supply circuits.

According to this invention, for example, in a case of having three power supply circuits, a precharge process is performed with the first relay and the third relay of a first power supply circuit (which may be replaced by a second or third power supply circuit) provided in a conductive state, and precharging is completed when the charging rate of the capacitor reaches 80%. After finish of this precharging, with the second relay and the third relay of the first power supply circuit provided in the conductive state, an immobility failure of the second relay (or the third relay) of the first power supply circuit can be detected before the charging rate of the capacitor reaches 90%. With the second relay and the third relay of the second power supply circuit provided in the conductive state, an immobility failure of the second relay (or the third relay) of the second power supply circuit can be detected before the charging rate of the capacitor reaches 95%. With the second relay and the third relay of the third power supply circuit provided in the conductive state, an immobility failure of the second relay (or the third relay) of the third power supply circuit can be detected before the charging rate of the capacitor reaches 100%. Therefore, abnormality of relays in power supply circuits having three power storage mechanisms can be accurately detected by one precharging.

It is further preferable that the detection unit detects immobility of any of the second relay and the third relay of the power supply circuit that supplies electric power to the capacitor when the capacitor is charged with division.

According to this invention, it is possible to detect immobility of any of the second relay and the third relay in a power supply circuit that supplies electric power to the capacitor when the capacitor is charged with division. By repeating this detection, abnormality of relays in power supply circuits having a plurality of power storage mechanisms can be detected before the capacitor is fully charged after precharging (a charging rate of 80%).

It is further preferable that within a time determined in advance from start of conduction, if the voltage value of the load fails to reach a threshold value, or if the charging rate of the capacitor fails to reach a threshold rate determined in advance, the detection unit detects immobility of any of the second relay and the third relay in the power supply circuit that supplies electric power to the capacitor.

According to this invention, the second relay and the third relay are provided in a conductive state, the charging rate of the capacitor is divided after the precharge process, and the capacitor is charged. At this point, if the second relay and the third relay of the power supply circuit being an object of abnormality detection are normal, within a time determined in advance, the voltage value of the load reaches a threshold value, and the charging rate of the capacitor reaches a threshold rate determined in advance. However, if within a time determined in advance from the start of conduction, the voltage value of the load fails to reach the threshold value, or the charging rate of the capacitor fails to reach the threshold rate determined in advance, this means that any one of the second relay and the third relay in a power supply circuit that supplies electric power to the capacitor is immobile such that an electric closed circuit is not formed. This makes it possible to detect immobility of any one of the second relay and the third relay in the power supply circuit that supplies electric power to the capacitor.

A control device for power supply circuits according to further another aspect of the present invention controls the foregoing power supply circuits. The control device includes: a voltage detection unit detecting a voltage value of the load; a precharge processing unit performing a precharge process, upon power supply startup, with a charging rate of a capacitor divided, the capacitor provided in parallel to the load and being an object of the precharge process, by sequentially using each of the power supply circuits, the precharge process being performed by causing a conductive state of the first relay and the third relay before causing the conductive state of the second relay and the third relay in each of the power supply circuits; and a detection unit detecting immobility of any of the first relay and the third relay in each of the plurality of power supply circuits, based on at least one of the detected voltage value of the load and the charging rate of the capacitor during the precharge process performed with division.

According to this invention, a precharge process is performed with the charging rate of a capacitor being an object of the precharge process divided. The first relay through a limiting resistor and the third relay is provided in a conductive state, the charging rate of the capacitor that is an object of the precharge process is divided, and electric power is supplied from any power supply circuit (the power supply circuit being an object of failure detection). The capacitor is thus charged (precharged). For example, if the third relay is normal and the first relay is also normal, a closed circuit is formed between the power supply circuit and the load, and a precharge process is performed. The voltage value of the load increases, and the charging rate of the capacitor also increases. However, if the voltage value of the load does not increase, and the charging rate of the capacitor also does not increase (for example, assuming that the third relay is normal), it can be determined that the first relay of the power supply circuit being an object of failure detection is immobile and is not conductive. Further, to detect a failure of the first relay of another power supply circuit, the charging rate of the capacitor in the precharge process is divided. The capacitor is therefore not in the full charge state when the failure detection of the first power supply circuit is finished. Therefore, without discharging the capacitor, immobility of the third relay (which may be replaced by the first relay) can be detected with the first relay and the third relay in the second power supply circuit further provided in the conductive state. In this way, the charging rate of the capacitor in the precharge process is divided corresponding to the number of power supply circuits (equal to the number of detecting abnormality of relays), so that a failure of relays in the plurality of power supply circuits can be detected before the capacitor is precharged one time. As a result, it is possible to provide a control device of power supply circuits capable of accurately detecting abnormality of relays in power supply circuits having a plurality of power storage mechanisms during one precharging.

It is preferable that the precharge processing unit performs the precharge process, with division performed corresponding to a number of the plurality of power supply circuits.

According to this invention, for example, in the case of having three power supply circuits, when a precharge process is performed with the first relay and the third relay of a first power supply circuit provided in the conductive state, an immobility failure of the first relay (or the third relay) of the first power supply circuit can be detected before the charging rate of the capacitor reaches 20%. With the first relay and the third relay of the second power supply circuit provided in the conductive state, an immobility failure of the first relay (or the third relay) of the second power supply circuit can be detected before the charging rate of the capacitor reaches 40%. With the first relay and the third relay of the third power supply circuit provided in the conductive state, an immobility failure of the first relay (or the third relay) of the third power supply circuit can be detected before the charging rate of the capacitor reaches 80%. Therefore, abnormality of relays in power supply circuits having three power storage mechanisms can be accurately detected by one precharging.

It is further preferable that the detection unit detects immobility of any of the first relay and the third relay of the power supply circuit that supplies electric power to the capacitor when charging the capacitor with division.

According to this invention, it is possible to detect immobility of any one of the first relay and the third relay in a power supply circuit that supplies electric power to the capacitor when the capacitor is charged with division as a precharge process. By repeating this detection, abnormality of relays in power supply circuits having a plurality of power storage mechanisms can be detected by one precharging.

It is further preferable that within a time determined in advance from start of conduction, if the voltage value of the load fails to reach a threshold value, or if the charging rate of the capacitor fails to reach a threshold rate determined in advance, the detection unit detects immobility of any of the first relay and the third relay in the power supply circuit that supplies electric power to the capacitor.

According to this invention, the first relay and the third relay are provided in the conductive state, the charging rate of the capacitor that is an object of a precharge process is divided, and the capacitor is charged. At this point, if the first relay and the third relay of the power supply circuit being an object of abnormality detection are normal, within a time determined in advance, the voltage value of the load reaches a threshold value, and the charging rate of the capacitor reaches a threshold rate determined in advance. However, if within the time determined in advance from the start of conduction, the voltage value of the load fails to reach the threshold value, or the charging rate of the capacitor fails to reach the threshold rate determined in advance, this means that any one of the first relay and the third relay in a power supply circuit that supplies electric power to the capacitor is immobile such that an electric closed circuit is not formed. This makes it possible to detect immobility of any one of the first relay and the third relay in the power supply circuit that supplies electric power to the capacitor.

BEST MODES FOR CARRYING OUT THE INVENTION

Figure 1:
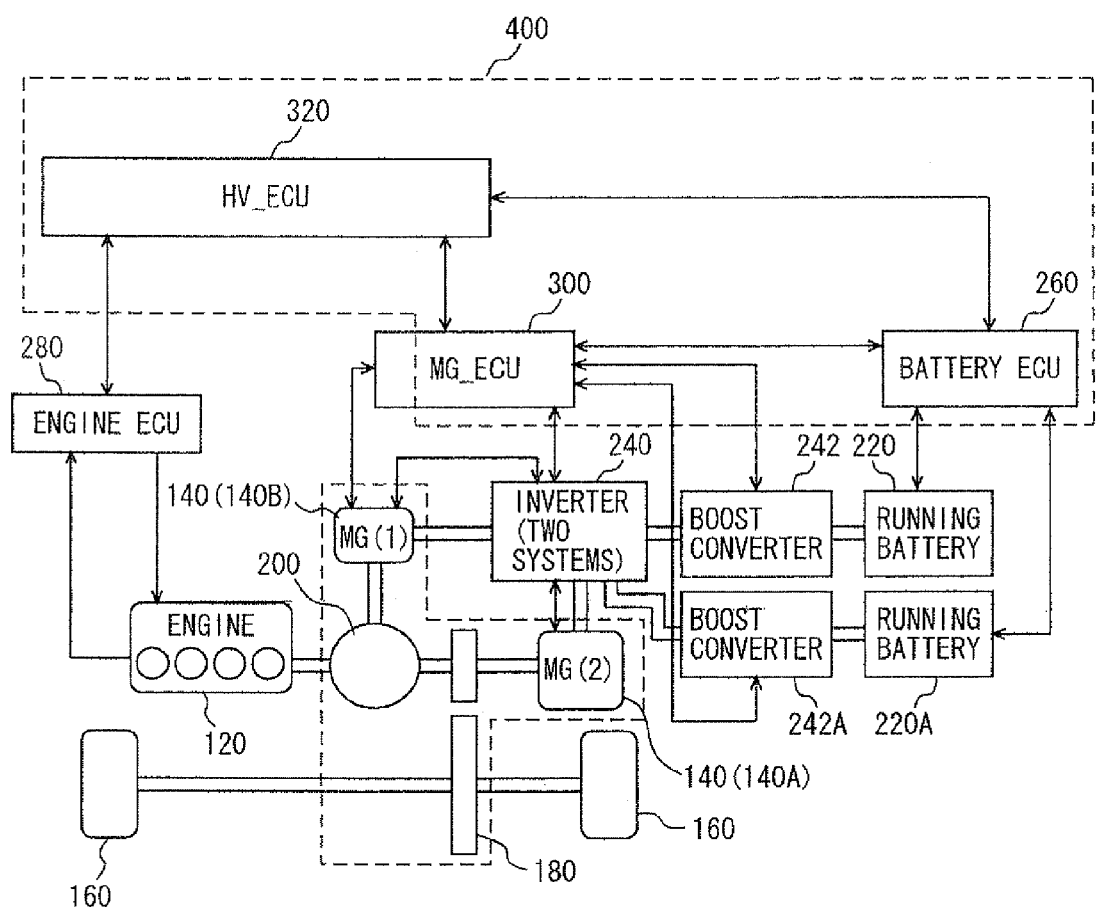
FIG. 1 is a control block diagram of a hybrid vehicle including a control device in a first embodiment of the present invention.

Hereinafter, referring to the drawings, embodiments of the present invention will be described. In the following description, the same components are denoted by the same reference characters. Their names and functions are also the same. Detailed description thereof is therefore not repeated.

First Embodiment

With reference to FIG. 1, a control block diagram of the whole hybrid vehicle including a control device in a first embodiment of the present invention is described.

It should be noted that the present invention is not limited to a hybrid vehicle shown in FIG. 1. In the present invention, an internal combustion engine (hereinafter described as an "engine"), such as a gasoline engine, as a power source needs only to be a driving source (running source) for running a vehicle and a driving source of a generator. Further, a vehicle needs only to be one whose driving source is an engine and a motor generator and that can run by the power of the motor generator (regardless of whether the engine is stopped or not), and may be a hybrid vehicle that has another mode and on which a battery for running is mounted (not limited to hybrid vehicles of the so-called series type, parallel type and the like). Further, the present invention can be applied to an electric vehicle and a fuel cell vehicle that do not have an engine. Note that this battery is a nickel-hydrogen battery, a lithium-ion battery or the like, and its kind is not particularly limited. As a power storage mechanism, a capacitor may be used instead of a battery. Further, the number of units of power supply circuits including batteries may be two or more.

The hybrid vehicle includes an engine 120 and a motor generator (MG) 140. Note that, hereinafter, although motor generator 140 is represented as a motor generator 140A (or MG (2) 140A) and a motor generator 140B (or MG (1) 140B) for the convenience of description, motor generator 140A functions as a generator and motor generator 140B functions as a motor depending on the running state of the hybrid vehicle. In a case where this motor generator functions as a generator, regenerative braking is performed. When a motor generator functions as a generator, kinetic energy of a vehicle is converted to electric energy to decelerate the vehicle.

The hybrid vehicle includes, in addition to these components, a reduction gear 180 that transmits power generated in engine 120 and motor generator 140 to driving wheels 160 and transmits drive of driving wheels 160 to engine 120 and motor generator 140, a power split mechanism (e.g., a planetary gear mechanism to be described later) 200 that distributes power generated by engine 120 to two routes of driving wheels 160 and motor generator 140B (MG (1) 140B), a battery 220 for running and a battery 220A for running (hereinafter referred to as a "running battery 220" and a "running battery 220A", respectively) that perform charging of electric power for driving motor generator 140, a two-system inverter 240 that performs current control while converting the dc of running battery 220 and running battery 220A and the ac of motor generator 140A (MG (2) 140A) and motor generator 140B (MG (1) 140B), a battery control unit (hereinafter referred to as a "battery ECU (electronic control unit)") 260 that manages and controls charging and discharging states (e.g., SOC (state of charge)) of running battery 220, an engine ECU 280 that controls the operating state of engine 120, an MG_ECU 300 that controls motor generator 140 and battery ECU 260, inverter 240 and the like in accordance with the state of the hybrid vehicle, an HV_ECU 320 that mutually manages and controls battery ECU 260, engine ECU 280, MG_ECU 300 and the like to control the whole hybrid system so as to allow the hybrid vehicle to travel most efficiently, and the like.

In the present embodiment, a boost converter 242 and a boost converter 242A are provided between inverter 240, and running battery 220 and running battery 220A. This means that since the rated voltages of running battery 220 and running battery 220A are lower than those of motor generator 140A (MG (2) 140A) and motor generator 140B (MG (1) 140B), electric power is boosted by boost converter 242 and boost converter 242A when electric power is supplied from running battery 220 and running battery 220A to motor generator 140A (MG (2) 140A) and motor generator 140B (MG (1) 140B). Note that when charging, charging electric power is stepped down by these boost converters and is supplied to running battery 220 and running battery 220A. In the present embodiment, a control device applied to a power supply circuit having two power supply systems is described. However, the present invention may be a power supply circuit having three or more power supply systems.

Note that each ECU is separately configured in FIG. 1, but ECUs may be configured as a single ECU by combining two or more ECUs (e.g., as indicated by a dotted line in FIG. 1, an ECU (such as an ECU 400 in FIG. 3) in which MG_ECU 300, HV_ECU 320 and battery ECU 260 are combined is one example of it).

In power split mechanism 200, a planetary gear mechanism (planetary gear) is used to distribute power of engine 120 both to driving wheels 160 and to motor generator 140B (MG (1) 140B). By controlling the rotational speed of motor generator 140B (MG (1) 140B), power split mechanism 200 functions also as a continuously variable transmission. The torque of engine 120 is inputted to a carrier (C), and it is transmitted to motor generator 140B (MG (1) 140B) by a sun gear (S) and is transmitted to motor generator 140A (MG (2) 140A) and an output shaft (on a side of driving wheels 160) by a ring gear (R). When stopping engine 120 during rotation, engine 120 is rotating, and therefore kinetic energy of the rotation is converted to electric energy by motor generator 140B (MG (1) 140B) to reduce the rotational speed of engine 120.

In a hybrid vehicle on which a hybrid system is mounted as shown in FIG. 1, when conditions determined in advance for the state of the vehicle are met, HV_ECU 320 controls engine 120 through motor generator 140A (MG (2) 140A) and engine ECU 280 so that the hybrid vehicle is run only by motor generator 140A (MG (2) 140A) of motor generator 140. For example, the conditions determined in advance includes one in which the SOC of running battery 220 is more than a value determined in advance. In this way, when the efficiency of engine 120 is poor upon starting, during low-speed running and the like, a hybrid vehicle can be run only by motor generator 140A (MG (2) 140A). As a result, the SOC of running battery 220 can be reduced (running battery 220 can be charged when the vehicle stops after that).

During normal running, for example, power of engine 120 is divided into two routes by power split mechanism 200 such that driving wheels 160 are directly driven on one route, and motor generator 140B (MG (1) 140B) is driven to generate electric power on the other route. At this point, motor generator 140A (MG (2) 140A) is driven by the generated electric power to assist in driving of driving wheels 160. During high-speed running, electric power from running battery 220 and/or running battery 220A is further supplied to motor generator 140A (MG (2) 140A) to increase output of motor generator 140A (MG (2) 140A), supplying additional driving force to driving wheels 160. On the other hand, during deceleration, motor generator 140A (MG (2) 140A) driven by driving wheels 160 functions as a generator to regenerate electric power, and the collected electric power is stored in running battery 220 and/or running battery 220A. Note that if the amount of electric power stored in running battery 220 and/or running battery 220A decreases and charging is particularly needed, the output of engine 120 is increased to increase the amount of electric power generated by motor generator 140B (MG (1) 140B). The amount of electric power stored in running battery 220 and/or running battery 220A is thus increased.

The target SOC of running battery 220 and running battery 220A is normally set at about 60% so that energy can be recovered whenever regeneration is performed. To reduce battery deterioration of running battery 220 and running battery 220A, the upper limit and the lower limit of the SOC are set such that, for example, the upper control limit is 80% and the lower control limit is 30%. HV_ECU 320 controls electric power generation and regeneration by motor generator 140 and motor output through MG_ECU 300 so that the SOC does not exceed the upper limit and the lower limit. Note that the values mentioned here are one example, and are not particularly limited.

Figure 2:
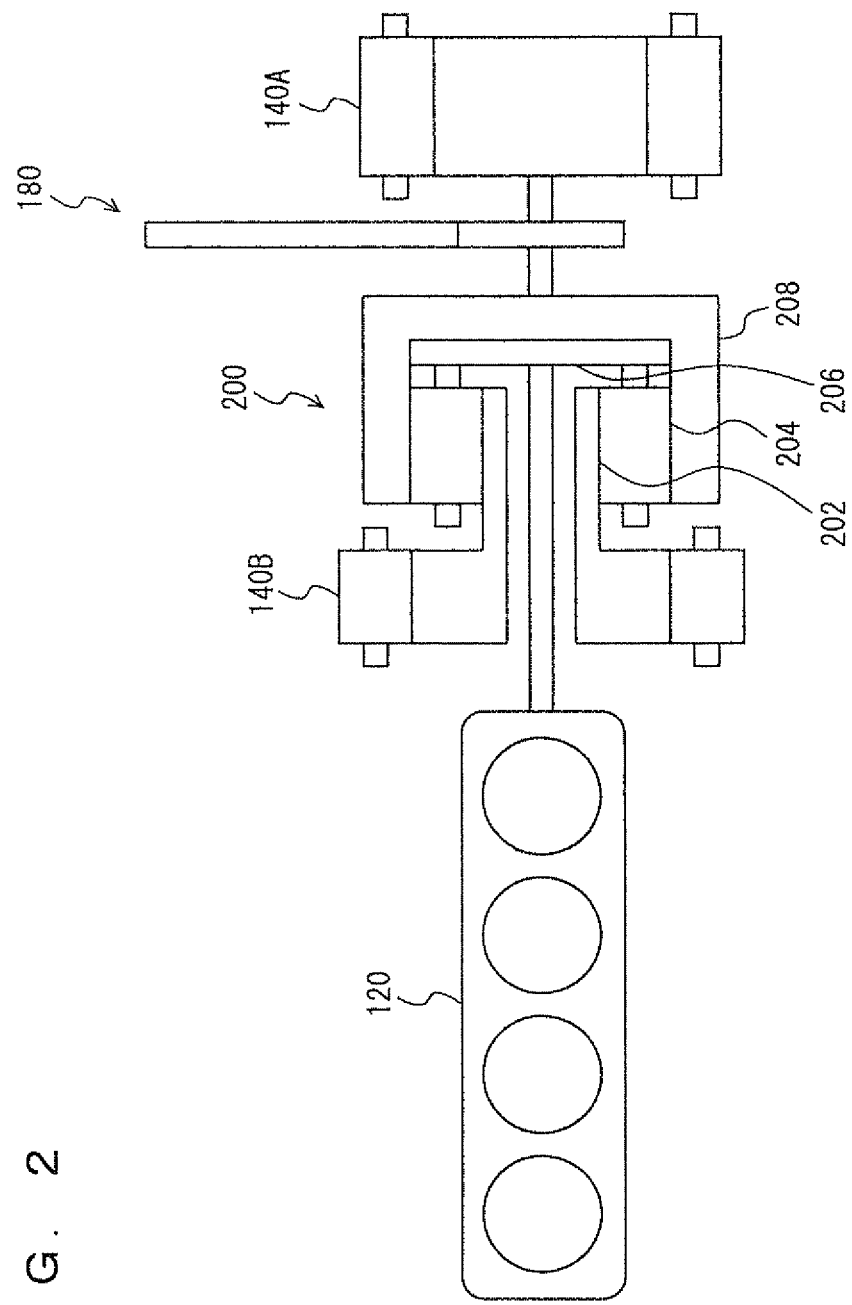
FIG. 2 shows a power split mechanism of FIG. 1.

Referring to FIG. 2, power split mechanism 200 is further described. Power split mechanism 200 is formed of a planetary gear including sun gears (S) 202 (hereinafter, described simply as "sun gears 202"), pinion gears 204, a carrier (C) 206 (hereinafter, described simply as a "carrier 206") and a ring gear (R) 208 (hereinafter, described simply as a "ring gear 208").

Pinion gear 204 is engaged with sun gear 202 and ring gear 208. Carrier 206 supports pinion gear 204 so as to allow pinion gear 204 to turn on its axis. Sun gear 202 is coupled to the rotational axis of MG (1) 140B. Carrier 206 is coupled to the crankshaft of engine 120. Ring gear 208 is coupled to the rotational axis of MG (2) 140A and a reduction gear 180.

By coupling engine 120, MG (1) 140B and MG (2) 140A through power split mechanism 200 formed of the planetary gear, the rotational speeds of engine 120, MG (1) 140B and MG (2) 140A have a relationship where they are connected with a straight line in collinear graphing.

Figure 3:
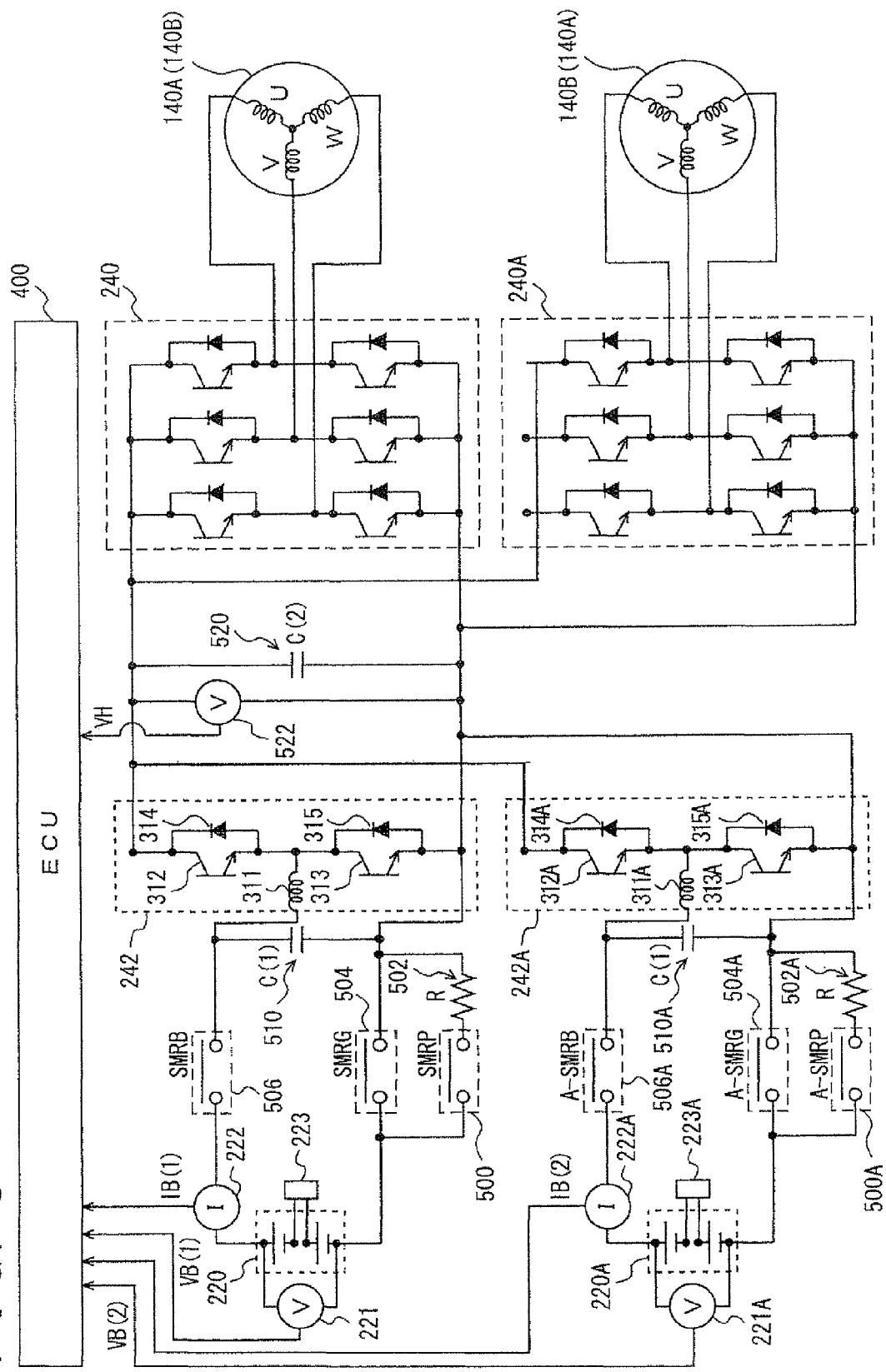
FIG. 3 shows a configuration of a power supply circuit controlled by the control device in the first embodiment of the present invention.

Referring to FIG. 3, power supply circuits controlled by a control device in an embodiment of the present invention are described. The power supply circuits include running battery 220 and running battery 220A, boost converter 242 and a boost converter 242A, inverter 240 and an inverter 240A, a capacitor C(1) 510 and a capacitor C(1) 510A, a capacitor C(2) 520, an SMRP 500, a limiting resistor 502, an SMRG 504, an SMRB 506, an A-SMRP 500A, a limiting resistor 502A, an A-SMRG 504A, an A-SMRB 506A and ECU 400. The control device in the present embodiment is implemented by a program executed by ECU 400.

Inverter 240 and inverter 240A include six IGBTs (insulated gate bipolar transistors) and six diodes each connected in parallel to each IGBT so that a current flows from the emitter side to the collector side of the IGBT. By turning on/off (conduction/non-conduction) the gate of each IGBT based on a control signal from ECU 400, inverter 240 and inverter 240A convert a dc current supplied from running battery 220 and running battery 220A to an ac current, and supplies the ac current to motor generator 140. Note that a known technique may be utilized for inverter 240 and inverter 240A, and IGBTs, and therefore further detailed description is not repeated here. Note also that, in FIG. 3, upper inverter 240 is an inverter for driving if motor generator 140A (140B) is one for driving, and lower inverter 240 is an inverter for electric power generation if motor generator 140A (140B) is one for electric power generation.

Boost converter 242 (in this paragraph, components of boost converter 242A are mentioned in parentheses) includes a reactor 311 (a reactor 311A), NPN transistors 312 and 313 (NPN transistors 312A and 313A) and diodes 314 and 315 (diodes 314A and 315A). One end of reactor 311 is connected to a power supply line of running battery 220 (running battery 220A), and the other end is connected to an intermediate point of NPN transistor 312 (NPN transistor 312A) and NPN transistor 313 (NPN transistor 313A), that is, across the emitter of NPN transistor 312 (NPN transistor 312A) and the collector of NPN transistor 313 (NPN transistor 313A). NPN transistors 312 and 313 (NPN transistors 312A and 313A) are connected in series between a power supply line and an earth line of inverter 240 (inverter 240A). The collector of NPN transistor 312 (NPN transistor 312A) is connected to the power supply line, and the emitter of NPN transistor 313 (NPN transistor 313A) is connected to the earth line. Diodes 314 and 315 (diodes 314A and 315A) causing a current to flow from the emitter side to the collector side are connected across the collectors and the emitters of NPN transistors 312 and 313 (NPN transistors 312A and 313A).

Boost converter 242 and boost converter 242A, in which NPN transistors 312 and 313 and NPN transistors 312A and 313A are turned on/off by ECU 400, steps up dc voltages supplied from capacitor C(1) 510 and capacitor C(1) 510A and supplies the output voltages to capacitor C(2) 520. During regenerative braking of a hybrid vehicle or an electric vehicle on which a motor drive circuit is mounted, boost converter 242 and boost converter 242A step down a dc voltage that is obtained by generating by motor generator 140 and converting the generated power by inverter 240 and/or inverter 240A, and supplies the voltage to capacitor C(1) 510 and capacitor C(1) 510A. Capacitor C(2) 520 smoothes the voltage of dc electric power supplied from boost converter 242 and/or boost converter 242A, and supplies the smoothed dc electric power to inverter 240 and/or inverter 240A.

Motor generator 140 is a three-phase ac motor. The rotational axis of motor generator 140 is connected to a drive shaft (not shown) of a vehicle as shown in FIG. 2, and transmits driving force to driving wheels. The vehicle is run by the driving force from motor generator 140.

Capacitor C(1) 510 and capacitor C(1) 510A are connected in parallel to inverter 240 and inverter 240A, respectively. Capacitor C(1) 510 and capacitor C(1) 510A once accumulate electric charges so as to smooth electric power supplied from each of running battery 220 and running battery 220A or electric power supplied from each of inverter 240 and inverter 240A. The smoothed electric power is supplied to each of inverter 240 and inverter 240A (during running of a motor) or each of running battery 220 and running battery 220A (during regenerative braking).

SMRP 500 and SMRG 504 are provided on the negative electrode of running battery 220. SMRP 500 and SMRG 504 are connected in parallel. Limiting resistor 502 is connected in series to SMRP 500. SMRP 500 is a precharge SMR that is connected prior to connection of SMRG 504, and that prevents a rush current from flowing in inverter 240. SMRG 504 is a negative SMR that is connected in parallel to SMRP 500 and limiting resistor 502 and that is connected after precharging is finished. SMRB 506 is a positive SMR provided on the positive electrode of running battery 220. Each SMR is controlled by ECU 400.

Likewise, A-SMRP 500A and A-SMRG 504A are provided on the negative electrode of running battery 220A. A-SMRP 500A and A-SMRG 504A are connected in parallel. Limiting resistor 502A is connected in series to A-SMRP 500A. A-SMRP 500A is an SMR for precharging that is connected prior to connection of A-SMRG 504A, and that prevents a rush current from flowing in inverter 240A. A-SMRG 504A is a negative SMR that is connected in parallel to A-SMRP 500A and limiting resistor 502A and that is connected after precharging is finished. A-SMRB 506A is a positive SMR provided on the positive electrode of running battery 220. Each SMR is controlled by ECU 400.

ECU 400 executes a program stored in a ROM (read only memory) based on an ignition switch and a start switch (both not shown), the amount of stepping on an accelerator pedal (not shown) and the amount of stepping on the brake pedal (not shown) to control inverter 240 and each SMR, so that the vehicle is run in a desired state. Connected to ECU 400 are an ammeter 222 that detects a current value IB (1) of running battery 220 and a voltmeter 221 that detects a voltage value VB (1) of running battery 220, and an ammeter 222A that detects a current value IB (2) of running battery 220A and a voltmeter 221A that detects a voltage value VB (2) of running battery 220A. Further connected to ECU 400 are a voltmeter 522 that detects a voltage value VH (inverter voltage) across capacitor C(2) 520.

SMRP 500, A-SMRP 500A, SMRG 504, A-SMRG 504A, SMRB 506 and A-SMRB 506A are relays in which a contact is closed when an exciting current is conducted to a coil. A relationship between operating states of SMRP 500, A-SMRP 500A, SMRG 504, A-SMRG 504A, SMRB 506 and A-SMRB 506A and positions of an ignition switch and a start switch is described. Note that the ON state of the SMR indicates a conductive state and the OFF state of the SMR indicates a non-conductive state.

There are an OFF position, an ACC position and an ON position in an ignition switch. During shutdown of power supply, that is, when the ignition switch is in the OFF position, ECU 400 turns off all of SMRP 500, A-SMRP 500A, SMRG 504, A-SMRG 504A, SMRB 506 and A-SMRB 506A. That is, exciting currents conducted to coils of SMRP 500, A-SMRP 500A, SMRG 504, A-SMRG 504A, SMRB 506 and A-SMRB 506A are turned off. Note that the position of the ignition switch is changed in the order of the OFF position, the ACC position and the ON position. Note that the switch to which the present invention is applied is not limited to such a switch.

Upon startup of a hybrid system (upon connection of a main power supply), that is, for example, when a driver steps on a braking pedal and presses a push-type switch, ECU 400 first turns on SMRB 506 and A-SMRB 506A and then turns on SMRP 500 and A-SMRP 500A to perform precharging. Since limiting resistor 502 is connected to SMRP 500 and limiting resistor 502A is connected to A-SMRP 500A, input voltage value VH to inverter 240 and inverter 240A gradually increases even when SMRP 500 and A-SMRP 500A are turned on. Occurrence of a rush current can thus be prevented.

It should be noted that a control device in the present embodiment may be applied to cases including a case where the position of an ignition switch does not have three positions mentioned above, and a case where a start switch also serves as an ignition switch.

When voltage value VH of inverter 240 and/or inverter 240A reaches a value, such as about 80% of battery voltage value VB, or when voltage value VH of inverter 240 and/or inverter 240A becomes approximately equal to battery voltage value VB, ECU 400 completes precharging. ECU 400 turns off SMRP 500 and turns on SMRG 504, and turns off A-SMRP 500A and turns on A-SMRG 504A. Note that time required for this precharging is determined in advance. The determined time is described as a "precharge time".

On the other hand, when the position of the ignition switch is changed from the ON position to the OFF position, ECU 400 first turns off SMRG 504 and A-SMRG 504A, and subsequently turns off SMRB 506 and A-SMRB 506A. As a result, electric connection between running battery 220 and inverter 240, and electric connection between running battery 220A and inverter 240A are interrupted. A power supply is in a shutdown state. At this point, the remaining voltage on the drive circuit side is discharged, gradually converging voltage value VH of inverter 240 and inverter 240A to about 0 V (voltage during shutdown). Note that the voltage value during shutdown needs not be 0 V. For example, the voltage value may be a weak voltage value of about 2 to 3 V.

A control device in the present embodiment accurately detects such abnormality (immobility and welding) of SMRs upon turning-on of an ignition switch, upon turning-on of a start button and upon turning-off of the ignition switch.

A control device in the present embodiment can be implemented either by hardware mainly including a configuration of a digital circuit and an analog circuit or by software mainly including a CPU (central processing unit) and a memory included in ECU 400 and a program that is read from the memory and is executed in the CPU. In general, implementation by hardware is advantageous in terms of an operation speed, and implementation by software is advantageous in terms of a design change. Hereinafter, the case of implementing the control device as software is described.

Figure 4:
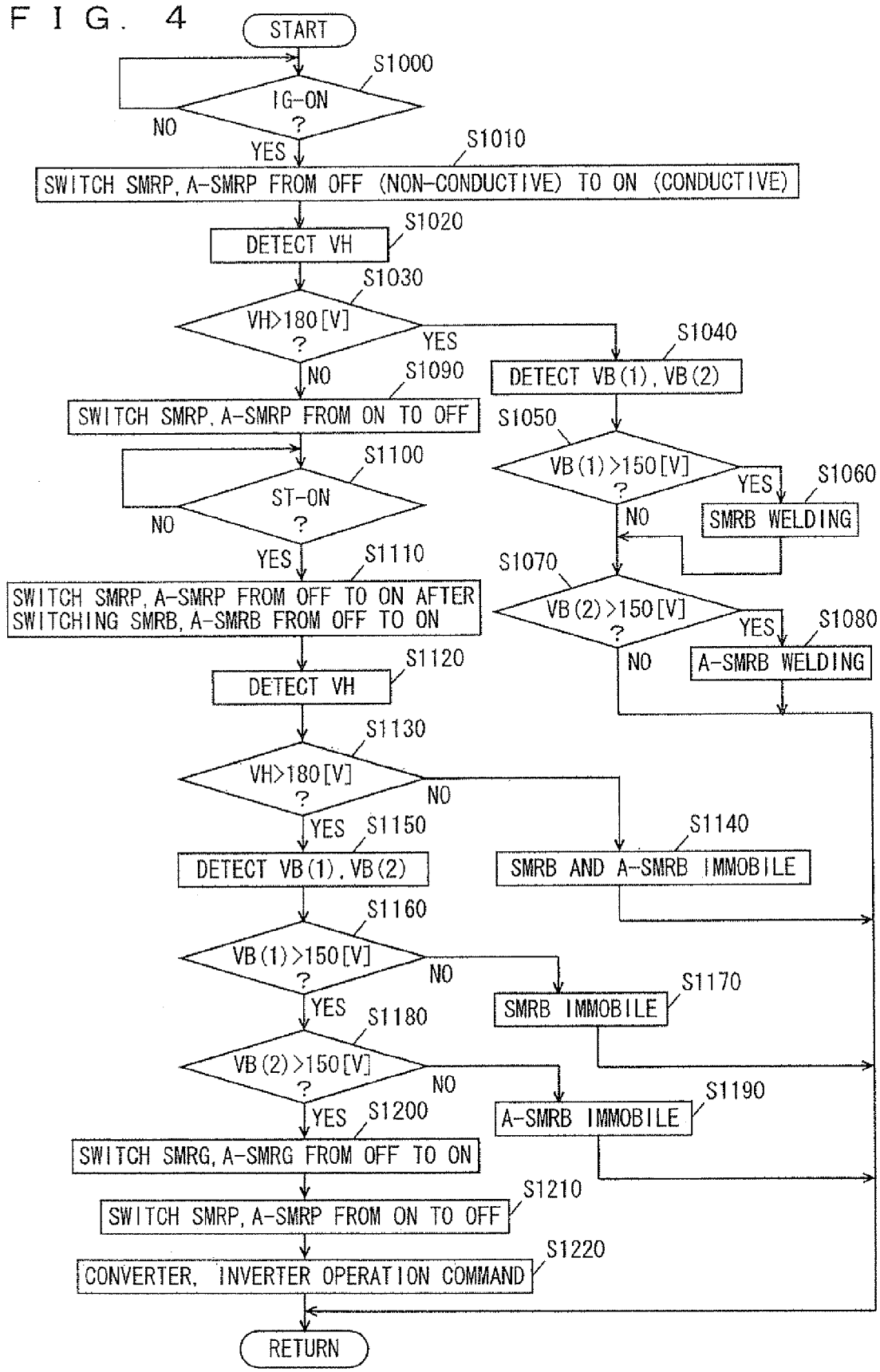
FIGS. 4 to 8 are flow charts showing a control structure of a program executed by an ECU of FIG. 3.

Referring to FIG. 4, the control structure of a startup program to be executed by ECU 400 for implementing a control device of power supply circuits in the present embodiment is described. Note that this program is a sub-routine, and is repeatedly executed in a cycle time determined in advance.

Further, threshold values for voltage values and current values in flow charts of FIGS. 4 to 8 to be described below are one example. The present invention is not limited to the threshold values.

Figure 5:
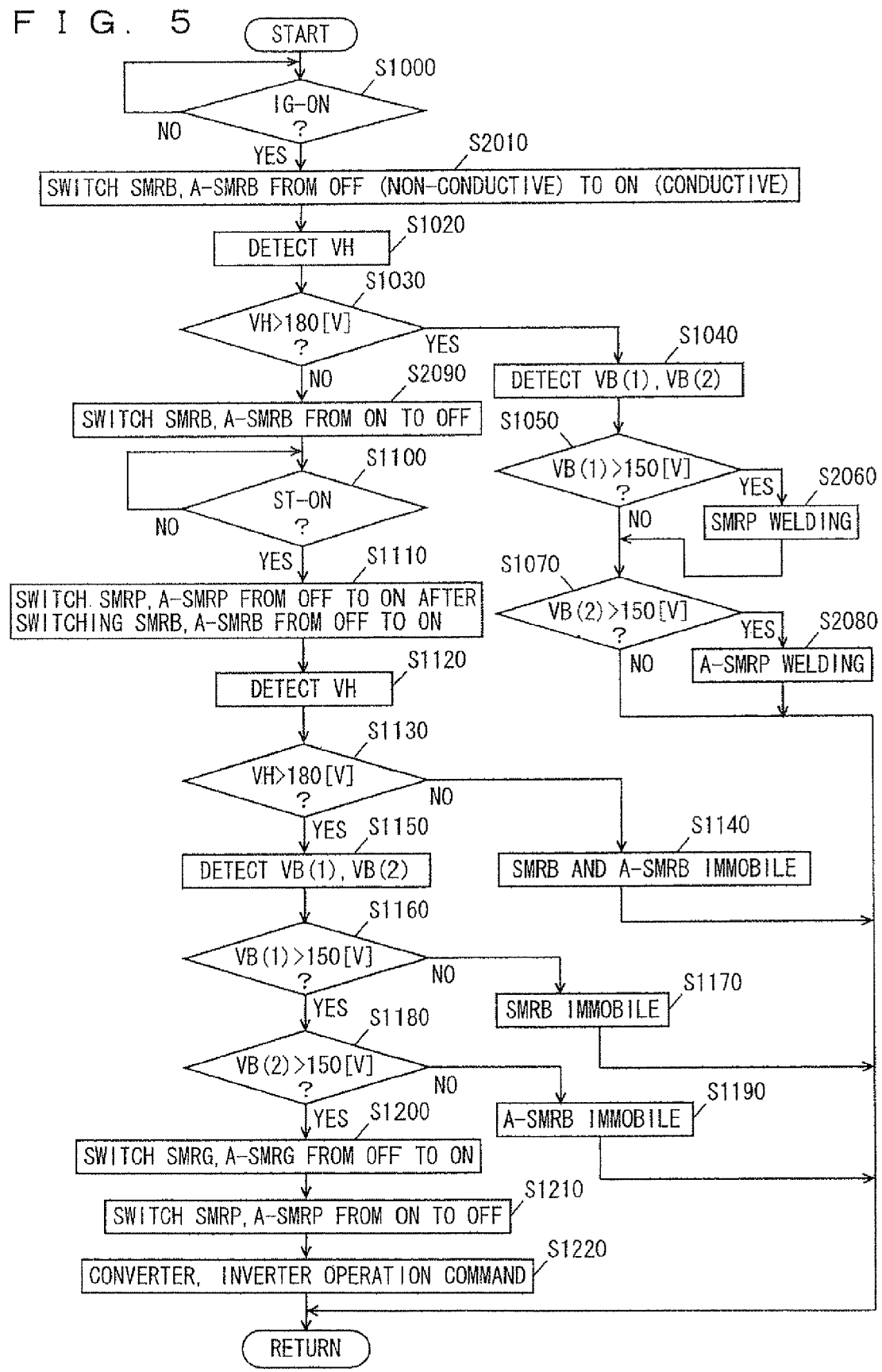

In FIGS. 4 and 5, the state where an OFF command signal (non-conductive state command signal) is outputted to all SMRs is assumed as the initial state of these flow charts. Note that in this initial state, it is assumed that an operating command (step-up command) signal is not output to boost converter 242 and boost converter 242A.

Figure 6:
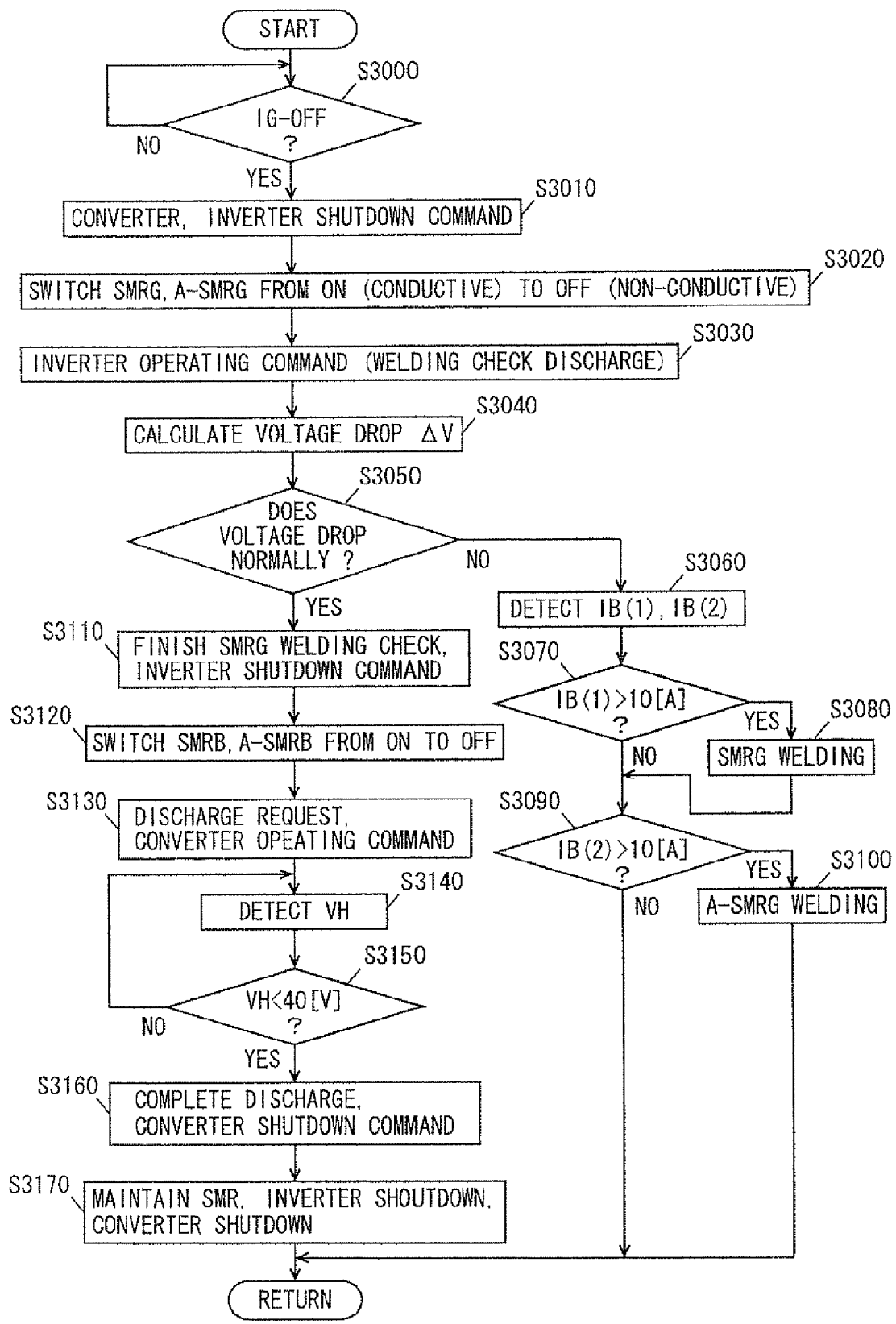
Figure 7:
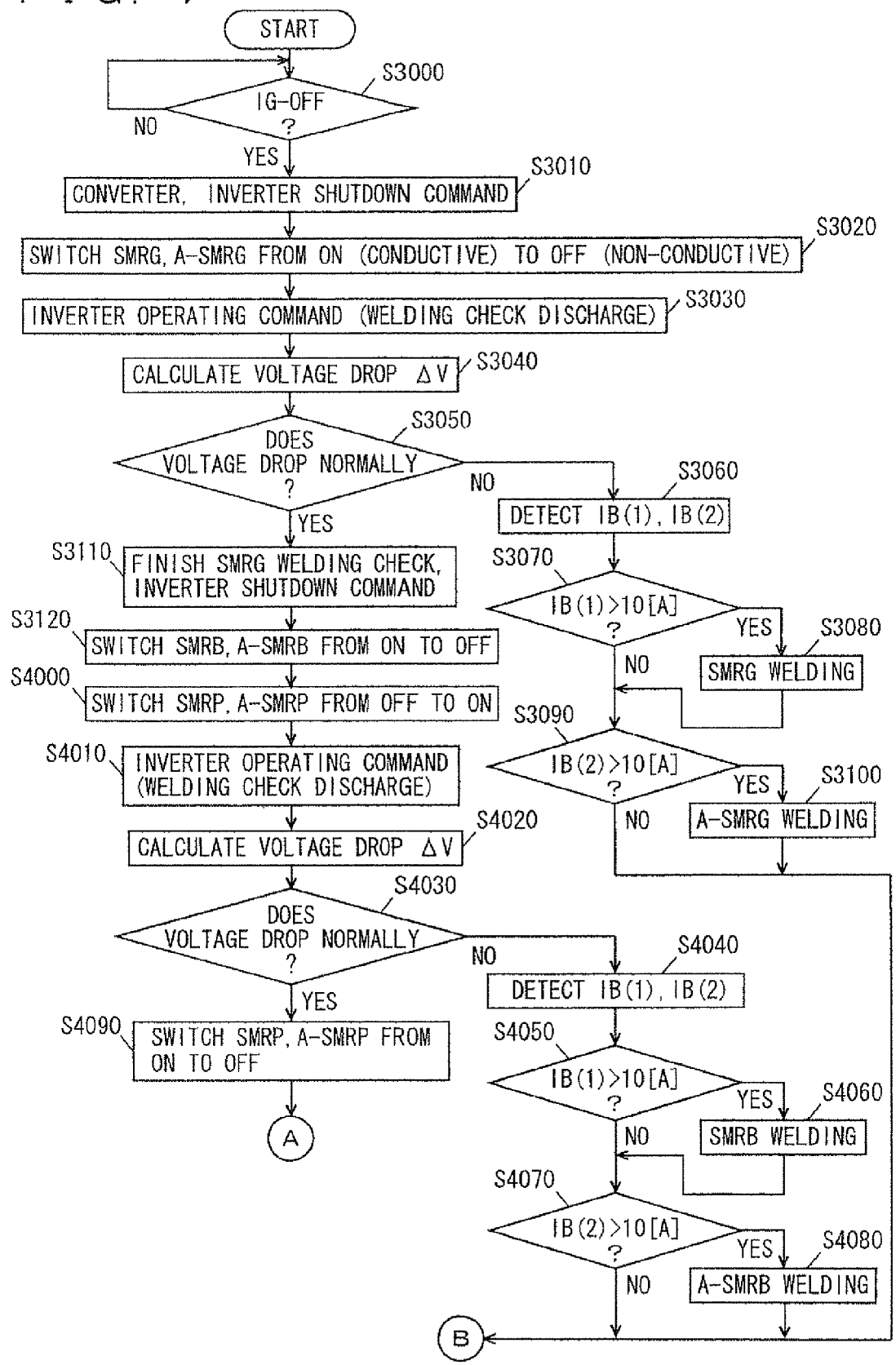

Further, in FIGS. 6 and 7, the state where an ON command signal (conductive state command signal) is outputted to SMRG 504 (A-SMRG 504A) and SMRB 506 (A-SMRB 506A) is assumed as the initial state of these flow charts.

In step (hereinafter, step is abbreviated as "S") 1000, ECU 400 determines whether an ignition switch operated by a driver is in the ON position or not. If the ignition switch is changed from the OFF position through the ACC position to the ON position (YES in S1000), the process is moved to S1010. If not (NO in S1000), the process is returned to S1000, and waits until the ignition switch is changed to the ON position.

In S1010, ECU 400 switches SMRP 500 and A-SMRP 500A from the OFF (non-conductive) state to the ON (conductive) state. In S1020, ECU 400 detects voltage value VH of inverter 240 and inverter 240A. In S1030, ECU 400 determines whether detected voltage value VH is higher than 180 V or not. If voltage value VH is higher than 180 V (YES in S1030), the process is moved to S1040. If not, (NO in S1030), the process is moved to S1090. Note that if voltage value VH is higher than 180V, startup of the system is permitted even if either voltage value VB (1) of running battery 220 or voltage value VB (2) of running battery 220A, which will be described later, is equal to or less than 150 V, which is a threshold value.

In S1040, ECU 400 detects voltage value VB (1) of running battery 220 and voltage value VB (2) of running battery 220A.

In S1050, ECU 400 determines whether detected voltage value VB (1) is higher than 150 V or not. If voltage value VB (1) is higher than 150 V (YES in S1050), the process is moved to S1060. If not (NO in S1050), the process is moved to S1070. In S1060, ECU 400 determines that SMRB 506 is welded (if an OFF command signal is received, a contact part does not separate and is electrically connected). Then, the process is moved to S1070 and performs determination of welding of A-SMRB 506A.

In S1070, ECU 400 determines whether detected voltage value VB (2) is higher than 150 V or not. If voltage value VB (2) is higher than 150V (YES in S1070), the process is moved to S1080. If not (NO in S1070), this process is terminated. In S1080, ECU 400 determines that A-SMRB 506A is welded. Then, this process is terminated.

Note that the threshold value 150V for voltage value VB (1) and voltage value VB (2) is the lower limit voltage value of the batteries, which are running battery 220 and running battery 220A. In S1060 and S1070, it is confirmed that running battery 220 and running battery 220A have values equal to or greater than the lower limit voltage value. This threshold value 150V may differ depending on kinds of batteries (kinds of batteries such as a nickel-hydrogen battery and a lithium-ion battery).

In S1090, ECU 400 finishes the process of determination of welding (determined as non-welding) of SMRB 506 and A-SMRB 506A, and switches SMRP 500 and A-SMRP 500A from the ON state to the OFF state.

In S1100, ECU 400 determines whether a start switch operated by a driver is in the ON position or not. If the start switch is pressed down to be changed to the ON position (YES in S1100), the process is moved to S1110. If not (NO in S1100), the process is returned to S1100, and waits until the start switch is changed to the ON position. It should be noted that as described above, in the present invention, switches are not limited to an ignition switch and a start switch. Therefore, the timing of starting the following process is not particularly limited to a timing at which a start switch is in the ON state as long as it is a timing at which a precharge process is started.

In S1110, ECU 400 switches SMRB 506 and A-SMRB 506A from the OFF state to the ON state, and thereafter switches SMRP 500 and A-SMRP 500A from the OFF state to the ON state. This causes precharging to be started.

In S1120, ECU 400 detects voltage value VH of inverter 240 and inverter 240A. In S1130, ECU 400 determines whether detected voltage value VH is higher than 180 V or not. If voltage value VH is higher than 180 V (YES in S1130), the process is moved to S1150. If not, (NO in S1130), the process is moved to S1140.

In S1140, ECU 400 determines that SMRB 506 and A-SMRB 506A are immobile (even when an ON command signal is received, a contact part remains separate to be not electrically connected) although SMRB 506 and A-SMRB 506A are determined to be non-welding and normal. Then this process is terminated.

In S1150, ECU 400 detects voltage value VB (1) of running battery 220 and voltage value VB (2) of running battery 220A.

In S1160, ECU 400 determines whether detected voltage value VB (1) is higher than 150 V or not. If voltage value VB (1) is higher than 150 V (YES in S1160), the process is moved to S1180. If not, (NO in S1160), the process is moved to S1170. In S1170, ECU 400 determines that SMRB 506 is immobile. Then, this process is terminated.

In S1180, ECU 400 determines whether detected voltage value VB (2) is higher than 150 V or not. If voltage value VB (2) is higher than 150V (YES in S1180), the process is moved to S1200. If not, (NO in S1180), the process is moved to S1190.

In S1190, ECU 400 determines that A-SMRB 506A is immobile. Then, this process is terminated.

In S1200, ECU 400 switches SMRG 504 and A-SMRG 504A from the OFF state to the ON state. Note that it is assumed that the precharge time has elapsed at any time point of this process of S1200. In S1210, ECU 400 switches SMRP 500 and A-SMRP 500A from the ON state to the OFF state. In S1220, ECU 400 outputs an operating command to boost converter 242 and boost converter 242A and to inverter 240 and inverter 240A.

Referring to FIG. 5, the control structure of another startup program to be executed by ECU 400 for implementing a control device of power supply circuits in the present embodiment is described. Note that this program is also a sub-routine, and is repeatedly executed in a cycle time determined in advance.

Further, in a flow chart of FIG. 5, the same processes as those shown in a flow chart of FIG. 4 are designated by the same step numbers. Contents of the processes are the same. Detailed description of the processes is therefore not repeated here.

A flow chart shown in FIG. 5 differs from that shown in FIG. 4 in a process up to S1100 shown in FIG. 4. In the flow chart shown in FIG. 4, determination of welding of SMRB 506 and/or A-SMRB 506A is performed in a process of S1000 to S1080. In the flow chart shown in FIG. 5, however, determination of welding of SMRP 500 and/or A-SMRP 500A is performed.

In S1000, ECU 400 determines whether an ignition switch operated by a driver is in the ON position or not. If the ignition switch is changed to the ON position (YES in S1000), the process is moved to S2010. If not (NO in S1000), the process is returned to S1000, and waits until the ignition switch is changed to the ON position.

In S2010, ECU 400 switches SMRB 506 and A-SMRB 506A from the OFF to the ON. In S1020, ECU 400 detects voltage value VH of inverter 240 and inverter 240A. In S1030, ECU 400 determines whether detected voltage value VH is higher than 180 V or not. If voltage value VH is higher than 180 V (YES in S1030), the process is moved to S1040. If not, (NO in S1030), the process is moved to S2090.

In S1040, ECU 400 detects voltage value VB (1) of running battery 220 and voltage value VB (2) of running battery 220A.

In S1050, ECU 400 determines whether detected voltage value VB (1) is higher than 150 V or not. If voltage value VB (1) is higher than 150 V (YES in S1050), the process is moved to S2060. If not (NO in S1050), the process is moved to S1070. In S2060, ECU 400 determines that SMRP 500 is welded (if an OFF command signal is received, a contact part does not separate and is electrically connected). Then, the process is moved to S1070 and performs determination of welding of A-SMRP 500A.

In S1070, ECU 400 determines whether detected voltage value VB (2) is higher than 150 V or not. If the voltage value VB (2) is higher than 150 V (YES in S1070), the process is moved to S2080. If not (NO in S1070), this process is terminated. In S2080, ECU 400 determines that A-SMRP 500A is welded. Then, this process is terminated.

In S2090, ECU 400 finishes the process of determination of welding (non-welding) of SMRP 500 and A-SMRP 500A, and switches SMRB 506 and A-SMRB 506A from the ON state to the OFF state. The subsequent processes are the same as those in FIG. 4.

Referring to FIG. 6, the control structure of a shutdown program to be executed by ECU 400 for implementing a control device of power supply circuits in the present embodiment is described. Note that this program is also a sub-routine, and is repeatedly executed in a cycle time determined in advance. The state where an ON command signal (conduction command signal) is outputted to SMRG 504 and A-SMRG 504A, and SMRB 506 and A-SMRB 506A (the state is not a precharge state, and therefore SMRP 500 and A-SMRP 500A are in the OFF state) are assumed as the initial state of this flow chart. Note that in this initial state, it is assumed that boost converter 242 and boost converter 242A and inverter 240 and inverter 240A are in operation.

In S3000, ECU 400 determines whether an ignition switch operated by a driver is in the OFF position or not. If the ignition switch is changed to the OFF position (YES in S3000), the process is moved to S3010. If not (NO in S3000), the process is returned to S3000, and waits until the ignition switch is changed to the OFF position.

In S3010, ECU 400 outputs a shutdown (stop of operating) command to boost converter 242 and boost converter 242A and to inverter 240 and inverter 240A.

In S3020, ECU 400 switches SMRG 504 and A-SMRG 504A from the ON state to the OFF state. In S3030, ECU 400 outputs an operating command to inverter 240 and inverter 240A for a welding check using a discharge process. That is, running battery 220 and running battery 220A are separated from inverter 240 and inverter 240A, and a discharge process is performed. At this point, welding of SMRG 504 and/or A-SMRG 504A is determined.

In S3040, ECU 400 calculates a voltage drop ΔV of inverter voltage value VH. In S3050, ECU 400 determines whether the voltage normally drops or not. For example, voltage drop ΔV is larger than 40 V, it is determined that the voltage normally drops. If the voltage normally drops (YES in S3050), the process is moved to S3110. If not (NO in S3050), the process is moved to S3060.

In S3060, ECU 400 detects a current value IB (1) of running battery 220 and a current value IB (2) of running battery 220A.

In S3070, ECU 400 determines whether detected current value IB (1) is higher than 10 A or not. If current value IB (1) is higher than 10 A (YES in S3070), the process is moved to S3080. If not (NO in S3070), the process is moved to S3090. In S3080, ECU 400 determines that SMRG 504 is welded. Then, the process is moved to S3090 and performs determination of welding of A-SMRG 504A.

In S3090, ECU 400 determines whether detected current value IB (2) is higher than 10 A or not. If current value IB (2) is higher than 10 A (YES in S3090), the process is moved to S3100. If not (NO in S3090), this process is terminated. In S3100, ECU 400 determines that A-SMRG 504A is welded. Then, this process is terminated.

In S3110, ECU 400 completes the welding check of SMRG 504 and A-SMRG 504A, and outputs a shutdown command to inverter 240 and inverter 240A.

In S3120, ECU 400 switches SMRB 506 and A-SMRB 506A from the ON state to the OFF state. Note that if they are in the OFF state, the OFF state is maintained. Note that SMRB 506 and A-SMRB 506A are relays for which welding determination has not been performed. In S3130, ECU 400 outputs an operating command of boost converter 242 and boost converter 242A as a discharge request.

In S3140, ECU 400 calculates inverter voltage value VH. In S3150, ECU 400 determines whether detected voltage value VII is lower than 40 V or not. If voltage value is lower than 40 V (YES in S3150), the process is moved to S3160, if not (NO in S 3150), the process is returned to S3140, and the process continues until inverter voltage value VH becomes lower than 40 V by discharging. Note that this threshold value may be determined further lower by using the capacity of capacitor C(2) 520, a discharge time and the like.

In S3160, ECU 400 completes the discharge process, and outputs a shutdown command of boost converter 242 and boost converter 242A.

In S3170, ECU 400 turns off all SMRs (SMRP 500, A-SMRP 500A, SMRG 504, A-SMRG 504A, SMRB 506 and A-SMRB 506A), and shutdown (stop of operating) of inverter 240 and inverter 240A and maintains shutdown (stop of operating) of boost converter 242 and boost converter 242A.

Figure 8:
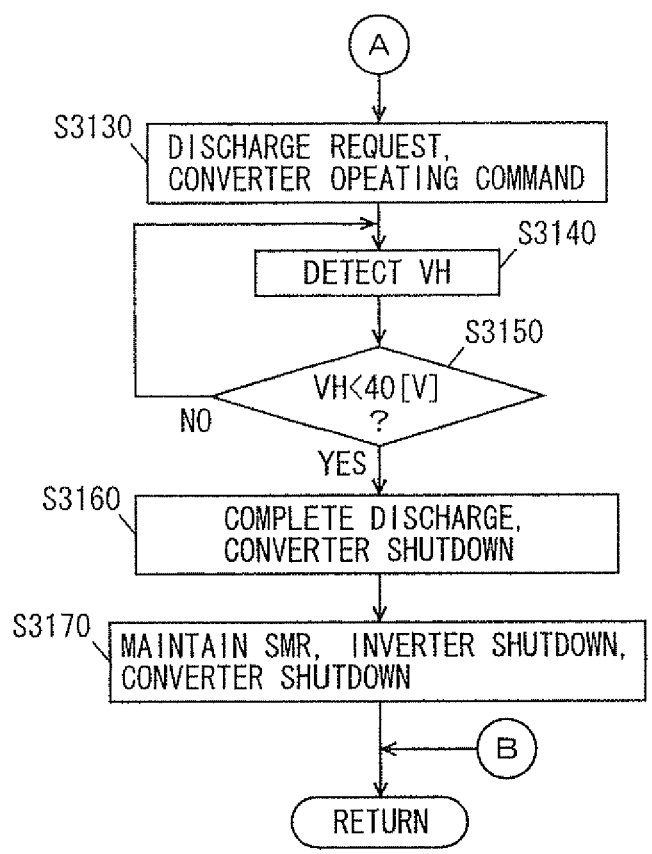

Referring to FIGS. 7 and 8, the control structure of another shutdown program to be executed by ECU 400 for implementing a control device of power supply circuits in the present embodiment is described. Note that this program is also a sub-routine, and is repeatedly executed in a cycle time determined in advance.

Further, in flow charts of FIGS. 7 and 8, the same processes as those shown in a flow chart of FIG. 6 are designated by the same step numbers. Contents of the processes are the same. Detailed description of the processes is therefore not repeated here.

In the flow charts shown in FIGS. 7 and 8, determination of welding of SMRB 506 and/or A-SMRB 506A is performed between a process of 3120 and a process of S3130.

In S4000, ECU 400 switches SMRP 500 and A-SMRP 500A from the OFF state to the ON state. In S4010, ECU 400 outputs an operating command to inverter 240 and inverter 240A for a welding check using a discharge process. That is, running battery 220 and running battery 220A are separated from inverter 240 and inverter 240A, and the discharge process is performed. At this point, welding of SMRB 506 and/or A-SMRB 506A is determined.

In S4020, ECU 400 calculates voltage drop ΔV of inverter voltage value VH. In S4030, ECU 400 determines whether the voltage normally drops or not. For example, voltage drop ΔV is larger than 40 V, it is determined that the voltage normally drops. If the voltage normally drops (YES in S4030), the process is moved to S4090. If not (NO in S4030), the process is moved to S4040.

In S4040, ECU 400 detects current value IB (1) of running battery 220 and current value IB (2) of running battery 220A.

In S4050, ECU 400 determines whether detected current value IB (1) is higher than 10 A or not. If current value IB (1) is higher than 10 A (YES in S4050), the process is moved to S4060. If not (NO in S4050), the process is moved to S4070. In S4060, ECU 400 determines that SMRB 506 is welded. Then, the process is moved to S4070 and performs determination of welding of A-SMRB 506A.

In S4070, ECU 400 determines whether detected current value IB (2) is higher than 10 A or not. If current value IB (2) is higher than 10 A (YES in S4070), the process is moved to S4080. If not (NO in S4070), this process is terminated. In S4080, ECU 400 determines that A-SMRB 506A is welded, Then, this process is terminated.

In S4090, ECU 400 switches SMRB 506 and A-SMRB 506A, and SMRP 500 and A-SMRP 500A from the ON state to the OFF state. Then, the process is moved to S3130 of FIG. 8.

Description is given on operations of ECU 400, which is a control device of power supply circuits in the present embodiment, based on the structure and flow charts as described above.

[Welding Check of SMRB and A-SMRB Upon Startup]

When a driver of a vehicle changes an ignition switch from the OFF position through the ACC position to the ON position (YES in S1000), SMRP 500 and A-SMRP 500A on the negative electrodes are switched from the OFF state to the ON state (S1010). Inverter voltage value VH is detected (S1020), and it is determined whether inverter voltage value VH is in a state of being higher than 180 V or not (S1030). Properly, a current does not flow, and therefore inverter voltage value VH is in a state of being not higher. However, if a current flows from running battery 220 and/or running battery 220A, inverter voltage value VH becomes a state of being higher (YES in S1030). As a cause of the flow of a current, welding of SMRB 506 and/or A-SMRB 506A on the positive electrodes is conceivable.

Therefore, when voltage value VB (1) of running battery 220 and voltage value VB (2) of running battery 220A are detected (S1040) and if voltage value VB (1) of running battery 220 is higher than 150 V (YES in S1050), it is determined that SMRB 506 is welded (YES in S1060). Likewise, if voltage value VB (2) of running battery 220A is higher than 150 V (YES in S1070), it is determined that A-SMRB 506A is welded (S1080). Note that if voltage value VB (1) of running battery 220 is higher than 150 V (YES in S1050) and voltage value VB (2) of running battery 220A is higher than 150 V (YES in S1070), it is determined that SMRB 506A and A-SMRB 506A are welded.

[Immobility Check of SMRB and A-SMRB During Precharging]

Even when the process is performed as described above and SMRP 500 and A-SMRP 500A on the negative electrodes are switched from the OFF state to the ON state (S1010), it is determined that SMRB 506A and A-SMRB 506A are not welded (SMRB welding check OK) unless inverter voltage value VH is in a state of being higher than 180 V (NO in S1030).

When SMRP 500 and A-SMRP 500A are switched from the ON state to the OFF state (S1090) and a driver of a vehicle sets a start switch at the ON position (YES in S1100), SMRB 506 and A-SMRB 506A on the positive electrodes are switched from the OFF state to the ON state, and then SMRP 500 and A-SMRP 500A on the negative electrode side for precharging are switched from the OFF state to the ON state (S1110). This causes precharging to be started.

Inverter voltage value VH is detected (S1120), and it is determined whether inverter voltage value VH is higher than 180 V or not (S1030). Properly, a current flows to cause inverter voltage value VH to become a state of being higher. However, if no current flows from running battery 220 and/or running battery 220A, inverter voltage value VH does not become a state of being higher (NO in S1130). As a cause of the flow of no current, immobility of SMRB 506 and immobility of A-SMRB 506A on the positive electrodes are determined (S1140).

Further, when inverter voltage value VH is in a state of being higher than 180 V (YES in S1030) but voltage value VB (1) of running battery 220 is lower than 150 V (NO in S1160), there is, for example, a state where the side of running battery 220A is electrically connected with inverter 240 and/or inverter 240A while the side of running battery 220 is not electrically connected with inverter 240 and/or inverter 240A. This indicates that SMRB 506 receives an ON command but cannot close an electric contact, and therefore is in a non-conductive state. Therefore, in this case (when voltage value VB (1) of running battery 220 is lower than 150 V (NO in S1160)), SMRB 506 is determined to be immobile (S1170).

Likewise (as an opposite pattern), when inverter voltage value VH is in a state of being higher than 180 V (YES in S1030) but voltage value VB (2) of running battery 220A is lower than 150 V (NO in S1180), there is a state where the side of running battery 220 is electrically connected with inverter 240 and/or inverter 240A while the side of running battery 220A is not electrically connected with inverter 240 and/or inverter 240A. This indicates that A-SMRB 506A receives an ON command but cannot close an electric contact, and therefore is in a non-conductive state. Therefore, in this case (when voltage value VB (2) of running battery 220A is lower than 150 V (NO in S1180)), A-SMRB 506A is determined to be immobile (S1190).

[Welding Check of SMRP and A-SMRP Upon Startup]

When a driver of a vehicle changes an ignition switch from the OFF position through the ACC position to the ON position (YES in S1000), SMRB 506 and A-SMRB 506A on the positive electrodes are switched from the OFF state to the ON state (S2010). Inverter voltage value VH is detected (S1020), and it is determined whether inverter voltage value VH is in a state of being higher than 180 V or not (S1030). Properly, a current does not flow, and therefore inverter voltage value VH is in a state of being not higher. However, if a current flows from running battery 220 and/or running battery 220A, inverter voltage value VH becomes a state of being higher (YES in S1030). As a cause of the flow of a current, welding of SMRP 500 and/or A-SMRP 500A on the negative electrodes is conceivable. Note that it is assumed that no welding of SMRG 504 and A-SMRG 504A is determined based on the operations to be described later.

Therefore, when voltage value VB (1) of running battery 220 and voltage value VB (2) of running battery 220A are detected (S1040) and if voltage value VB (1) of running battery 220 is higher than 150 V (YES in S1050), it is determined that SMRP 500 is welded (S2060). Likewise, if voltage value VB (2) of running battery 220A is higher than 150 V (YES in S1070), it is determined that A-SMRP 500A is welded (S2080). Note that if voltage value VB (1) of running battery 220 is higher than 150 V (YES in S1050) and voltage value VB (2) of running battery 220A is higher than 150 V (YES in S1070), it is determined that SMRP 500 and A-SMRP 500A are welded.

[Welding Check of SMRG and A-SMRG Upon Shutdown]

When a driver of a vehicle changes an ignition switch to the OFF position (YES in S3000), SMRG 504 and A-SMRG 504A on the negative electrodes are switched from the ON state to the OFF state (S3020).

An operating command is outputted to inverter 240 and/or inverter 240A (S3030), and residual electric charges of capacitor C(2) 520 flow to inverter 240 and/or inverter 240A.

Voltage drop ΔV of the inverter voltage is calculated (S3040), and it is determined whether the voltage normally drops or not (S3050). Properly, a current does not flow from running battery 220 and/or running battery 220A, and therefore there is a state where the voltage normally drops. However, if a current flows from running battery 220 and/or running battery 220A, the voltage of inverter voltage value VH does not decrease to cause a state where the voltage does not normally drop (NO in S3050). As a cause of the flow of a current, welding of SMRG 504 and/or A-SMRG 504A on the negative electrodes is conceivable.

Therefore, when current value IB (1) of running battery 220 and current value IB (2) of running battery 220A are detected (S3060) and if current value IB (1) of running battery 220 is higher than 10 A (YES in S3070), it is determined that SMRG 504 is welded (S3080). Likewise, if current value IB (2) of running battery 220A is higher than 10 A (YES in S3090), it is determined that A-SMRG 504A is welded (S3100). Note that if voltage value IB (1) of running battery 220 is higher than 10 A (YES in S3070) and current value IB (2) of running battery 220A is higher than 10 A (YES in S3090), it is determined that SMRG 504 and A-SMRG 504A are welded (S3100).

[Welding Check of SMRB and A-SMRB Upon Shutdown]

When a driver of a vehicle changes an ignition switch to the OFF position (YES in S3000) and the welding check of SMRG 504 and A-SMRG 504A on the negative electrodes is finished (YES in S3050, S3110), SMRB 506 and A-SMRB 506A are switched from the ON state to the OFF state (S3120), and SMRP 500 and A-SMRP 500A are switched from the OFF state to the ON state (S4000).

An operating command is outputted to inverter 240 and/or inverter 240A (S4010), and residual electric charges of capacitor C(2) 520 flow to inverter 240 and/or inverter 240A.

Voltage drop ΔV of the inverter voltage is calculated (S4020), and it is determined whether the voltage normally drops or not (S4030). Properly, a current does not flow from running battery 220 and/or running battery 220A, and therefore there is a state where voltage normally drops. However, if a current flows from running battery 220 and/or running battery 220A, the voltage of inverter voltage value VH does not decrease to cause a state where voltage does not normally drop (NO in S4030). As a cause of the flow of a current, welding of SMRB 506 and/or A-SMRB 506A on the positive electrodes is conceivable.

Therefore, when current IB (1) of running battery 220 and current value IB (2) of running battery 220A are detected (S4040) and if current value IB (1) of running battery 220 is higher than 10 A (YES in S4050), it is determined that SMRB 506 is welded (S4060). Likewise, if current value IB (2) of running battery 220A is higher than 10 A (YES in S4070), it is determined that A-SMRB 506A is welded (S4080). Note that if voltage value IB (1) of running battery 220 is higher than 10 A (YES in S4050) and current value IB (2) of running battery 220A is higher than 10 A (YES in S4070), it is determined that SMRB 506 and A-SMRG 506A are welded.

As described above, with a control device of power supply circuits in the present embodiment, in power supply circuits having a plurality of batteries, which include sets of an SMR for precharging (an SMR to which a resistor is connected in series), a negative SMR provided in parallel to this SMR for precharging, and a positive SMR, abnormality of SMRs can be accurately detected upon system startup and upon system shutdown.

In the processes of S1110 to S1190 of FIGS. 4 and 5, immobility of SMRB 506 and/or A-SMRB 506A is detected. Instead of this, immobility of SMRP 500 and/or A-SMRP 500A may be detected (provided that it is detected in advance that SMRB 506 and A-SMRB 506A are not immobile).

Further, when the order of detecting abnormality of SMRP 500 (A-SMRP 500A), the SMRG (A-SMRG 504A) and the SMRB (A-SMRB 506A) is set by appropriately combining flow charts shown in FIGS. 4 to 8, for example, it becomes possible to detect which of the SMRP (A-SMRP 500A) and the SMRG (A-SMRG 504A) provided in parallel is abnormal. For example, in S1030 to S2080 of FIG. 5, welding of the SMRP (A-SMRP 500A) is detected on a premise that the SMRG (A-SMRG 504A) is normal. The premise that the SMRG (A-SMRG 504A) is normal is determined in S3060 to S3100 of FIG. 7. Therefore, abnormality of the SMRP (A-SMRP 500A) can be detected in a process before this precharging on the premise that the SMRG (A-SMRG 504A) is normal in the previous discharge process. Note that this corresponds to a fact that limitation to a specific one relay does not exist in first, fifth and ninth inventions.

Further, either one the inverters may be used, and three or more inverters may also be used. In a case of two or more inverters (the load of a running battery), the power supply circuit is configured such that electric power supplied from a plurality of running batteries is once applied to a single capacitor C(2) 520 for smoothing. The voltage across capacitor C(2) 520 at this point is an inverter voltage (load voltage).

Second Embodiment

A second embodiment of the present invention will be described below.

A control device of power supply circuits in the present embodiment performs failure determination (SMR immobility determination) of an electric circuit including SMRs for electrically connecting a plurality of power supply systems (running batteries) and a load, in the same manner as in the first embodiment. In such a case of including a plurality of power supply systems (running batteries), if an immobility determination process in a single power supply system (running battery) is applied as in a conventional case, a path passing in another running battery may be formed because of the presence of a plurality of SMRs, leading to erroneous determination. It is therefore conceivable that the immobility determination in a single power supply system (running battery) is performed in series for each power supply circuit. In such a way, however, a configuration of common use of capacitor C(2) 520 on a high voltage side (see FIG. 3) is employed. Therefore, after capacitor C(2) is charged for failure determination of SMRs of the first power supply circuit, capacitor C(2) must be discharged for failure determination of SMRs of the following power supply circuit. A discharge time is therefore required each time failure determination of SMRs of one power supply circuit is completed. Time required until failure determination of SMRs of all power supply circuits is completed and then a system is started becomes long.

To address this disadvantage, in a control device in the present embodiment, after capacitor C(2) on a high voltage side reaches such a level (e.g., the charging rate of capacitor C(2) is 80%) that a failure of a power supply circuit (fixation of an SMRG) does not occur (in the present embodiment, a process up to this point at which the charging rate of capacitor C(2) reaches 80% is referred to as a "precharge process"), the SMRG and the SMRB of each power supply circuit are sequentially switched to the conductive state, thereby dividing the amount of electric power supply to capacitor C(2) in multiple stages (how much the amount of electric power supply is divided in a period with charging rates from 80% to 100% of capacitor C(2) depends on the number of power supply circuits for which failure determination is performed). That is, after precharging (after the charging rate of capacitor C(2) reaches 80% without welding of the SMRG), the connection and disconnection of the main SMRs (the SMRG and the SMRB) is time-divided, not through the limiting resistor of each power supply circuit, thereby sequentially increasing the charging rate of capacitor C(2). In this way, failure determination of the SMRG and/or SMRB of a plurality of power supply circuits is performed by only one full charging of capacitor C(2) on the high voltage side without the need for discharging of capacitor C(2) each time failure determination of SMRs of one power supply circuit is completed.

Note that the aforementioned control block diagram of the whole hybrid vehicle shown in FIG. 1 and power split mechanism 200 shown in FIG. 2 are the same as in the present embodiment, and therefore detailed description thereof is not repeated here.

Figure 9:
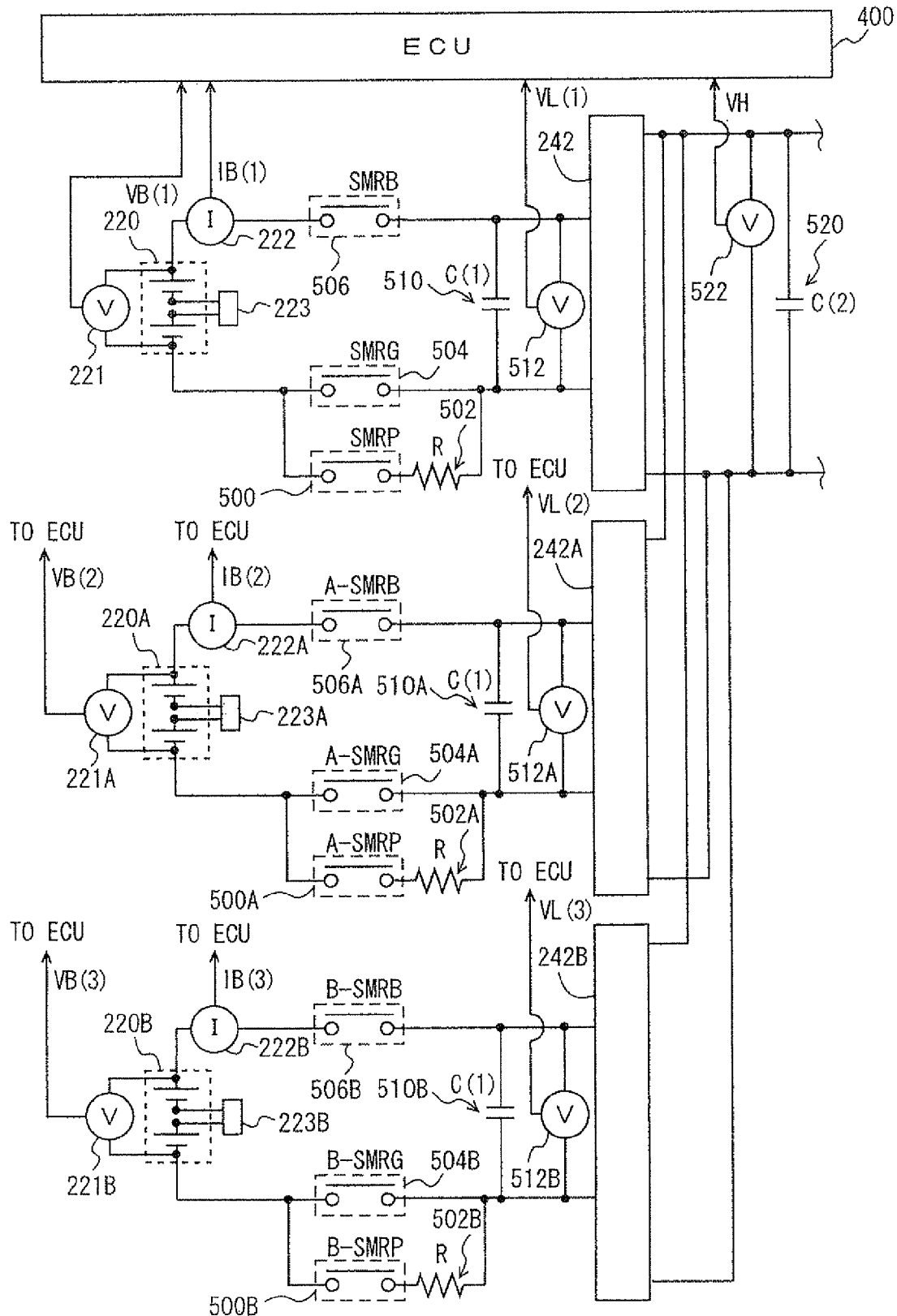
FIG. 9 shows a configuration of a power supply circuit controlled by a control device in a second embodiment of the present invention.

Referring to FIG. 9 corresponding to FIG. 3, power supply circuits controlled by a control device in an embodiment of the present invention is described. Further, the number of units of power supply circuits including batteries should be two or more. As shown in FIG. 9, the number of the units is three in description of the present embodiment. Further, in FIG. 9, only the running battery side from capacitor C(2) 520 on the high voltage side of FIG. 3 is shown.

Referring to FIG. 9, power supply circuits controlled by a control device in an embodiment of the present invention further includes, in addition to the power supply circuits shown in FIG. 3, another (third) running battery 22013, a boost converter 242B, a capacitor C(1) 510B, a B-SMRP 500B, a limiting resistor 502B, a B-SMRG S0413, and a B-SMRB 506B. Components other than the foregoing ones relevant to third running battery 220B further shown in FIG. 9 are denoted by the same reference numbers as those of structures relevant to second running battery 220A only with a difference between "A" and "B" at the end of a reference character. Therefore, detailed description thereof is not repeated here.

The control device in the present embodiment is implemented by a program executed by ECU 400. Note that a different program from the program executed by ECU 400 of the first embodiment is executed by ECU 400.

Figure 10:
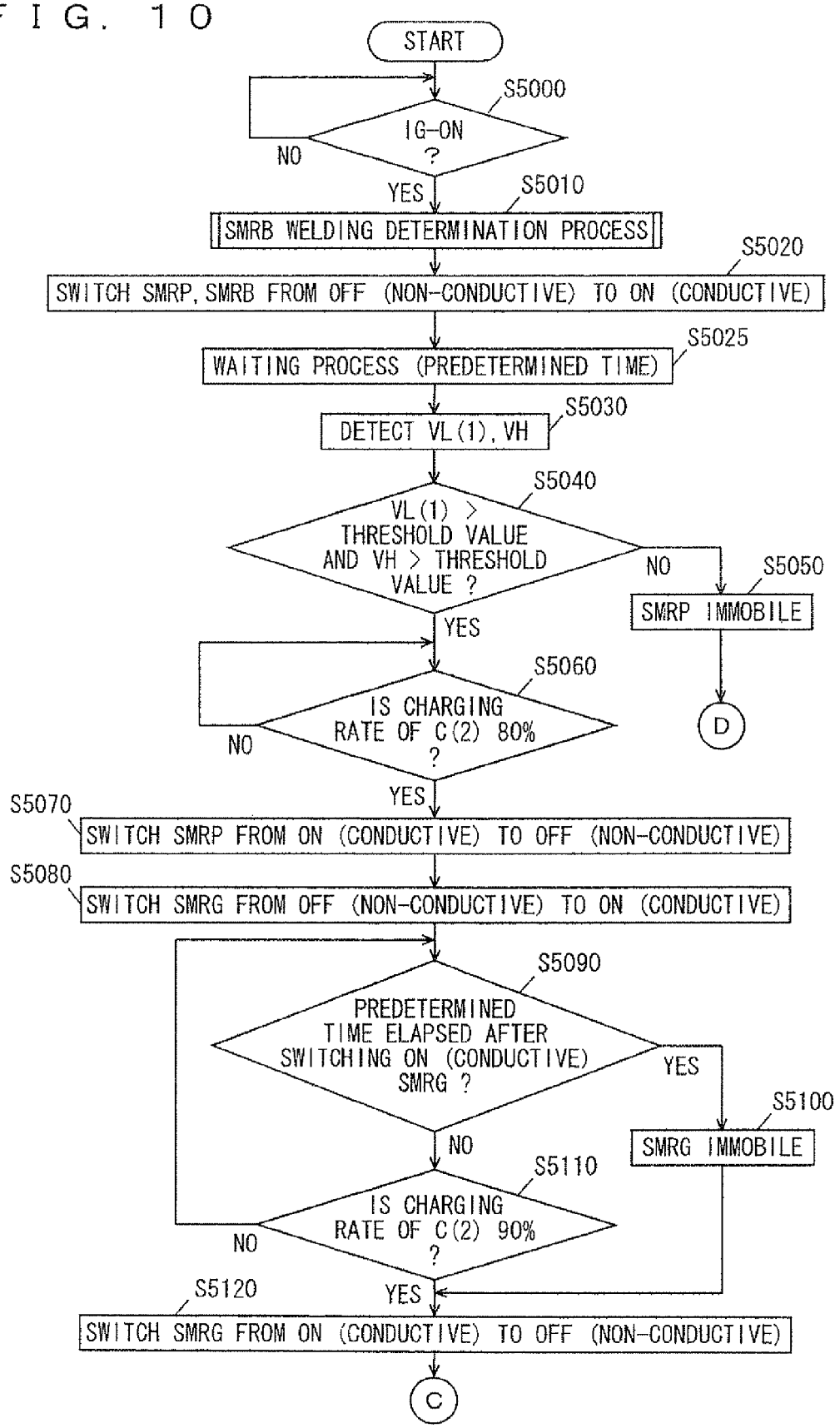
FIGS. 10 to 11 are flow charts showing a control structure of a program executed by an ECU of FIG. 9.
Figure 11:
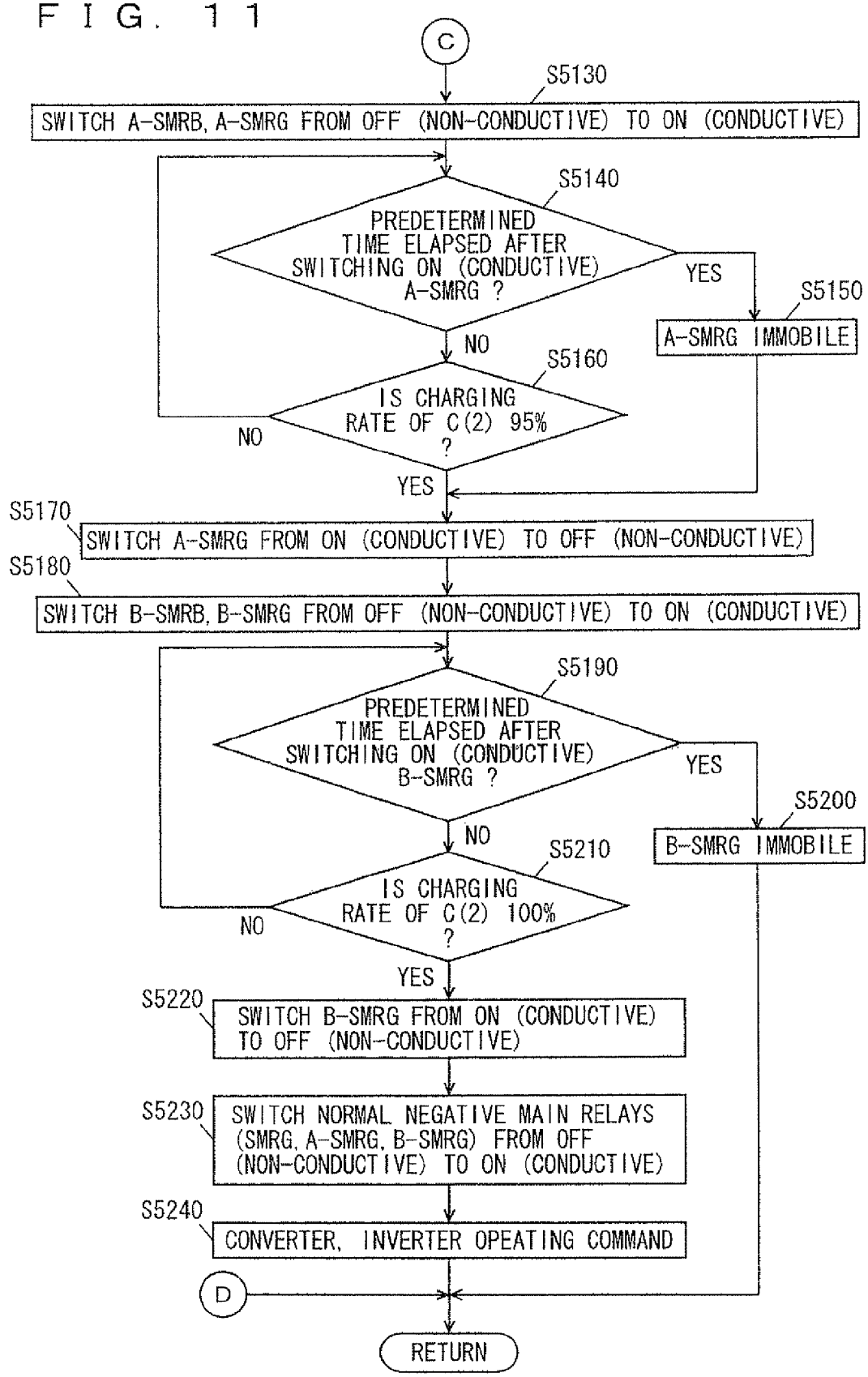

Referring to FIGS. 10 and 11, the control structure of a program to be executed by ECU 400 serving as a control device in the present embodiment is described.

In S5000, ECU 400 determines whether a start switch operated by a driver is in the ON position or not. If the start switch is pressed down to be changed to the ON position (YES in S5000), the process is moved to S5010. If not (NO in S5000), the process is returned to S5000, and waits until the start switch is changed to the ON position. Note that in the same manner as in the foregoing first embodiment, in the present embodiment, switches are not limited to an ignition switch and a start switch. Therefore, the timing of starting the following process is not particularly limited to a timing at which a start switch is in the ON state as long as it is a timing at which a precharge process is started.

In S5010, ECU 400 performs an SMRB welding determination process. At this point, as an example, processes of S1050 to S1080 (SMRB 506, A-SMRB 506A) of FIG. 4 in the foregoing first embodiment, and in addition thereto, a welding determination process of B-SMRB 506B are performed. Note that it is assumed that all SMRBs (hereinafter, the description of "all SMRB" indicates SMRB 506, A-SMRB 506A and B-SNRB 506B; description of "all SMRP" indicates SMRP 500, A-SMRP 500A and B-SMRP 500B; and the description of "all SMRG" indicates SMRG 504, A-SMRG 504A and B-SMRG 504B) are determined to be not welded.

In S5020, ECU 400 switches SMRP 500 and SMRB 506 from the OFF (non-conductive) state to the ON (conductive) state. This causes precharging to be started with electric power supplied form running battery 220.

In S5025, ECU 400 performs a process of waiting for a predetermined time. In this, consideration is given to time required for charging capacitor C(2) 520 on the high voltage side. Note that branch determination may be performed as in S5090 to be described later.

In S5030, ECU 400 detects a voltage value VL(1) of capacitor C(1) and voltage value VH of converter 240 (voltage value VII of capacitor C(2)). In S5040, ECU 400 determines whether detected voltage value VL(1) is higher than a threshold value (e.g., 180 V) and detected voltage value VH is higher than a threshold value (e.g., 180 V) or not. If voltage value VL(1) is higher than the threshold value and detected voltage value VH is higher than the threshold value (YES in S5040), the process is moved to S5060. If not (NO in S5040), the process is moved to S5050.

In S5050, ECU 400 determines that SMRP 500 is immobile. Then, this process is terminated (D in FIGS. 10 and 11). Note that at this point, a precharge process (S5020 to S5060) may be performed using other precharge SMRPs (A-SMRP 500A and B-SMRP 500B) to perform a SMRG failure detection process from S5080. That is, when any precharge SMRP operates, failure detection of an SMRG is enabled.

In S5060, for example, based on detected voltage value VII, ECU 400 determines whether the charging rate of capacitor C(2) 520 exhibits 80% or not (this 80% is one example, and may be appropriately changed so as to depend on the number of SMRs for which immobility is determined and to represent the value of precharging, (an SMRG is not welded even when electric power is supplied not through a limiting resistor)). If the charging rate of capacitor C(2) 520 reaches 80% (YES in S5060), it is determined that the precharge process is completed and the process is moved to S5070. If not (NO in S5060), the process is returned to S5060, and SMRP 500 and SMRB 506 are maintained in the ON (conductive) state until the charging rate of capacitor C(2)

520 reaches 80% (i.e., until the precharge process in the present embodiment is completed).

In S5070, ECU 400 switches SMRP 500 from the ON (conductive) state to the OFF (non-conductive) state. At this point, SMRB 506 remains in the ON (conductive) state.

In S5080, ECU 400 switches SMRG 504 from the OFF (non-conductive) state to the ON (conductive) state. This causes electric power to be supplied from running battery 220 through the main relay (meaning a relay without a limiting resistor) to the inverter serving as a load.

In S5090, ECU 400 determines whether or not a predetermined time has elapsed since SMRG 504 was switched to the ON (conductive) state. This is because consideration is given to the charging time of capacitor C(2) 520. The predetermined time has elapsed since SMRG 504 was switched to the ON (conductive) state (YES in S5090), the process is moved to S5100. If not (NO in S5090), the process is moved to S5110.

In S5100, ECU 400 determines that SMRG 504 is immobile. Then, the process is moved to S5120.

In S5100, for example, based on detected voltage value VH, ECU 400 determines whether the charging rate of capacitor C(2) 520 reaches 90% or not (this 90% is also one example, and it is preferable that this 90% be appropriately changed depending on the number of SMRs for which immobility is determined). If the charging rate of capacitor C(2) 520 reaches 90% (YES in S5110), the process is moved to S5120. If not (NO in S5110), the process is returned to S5090, and SMRB 506 and SMRG 504 are maintained in the ON (conductive) state until the predetermined time has elapsed and until the charging rate of capacitor C(2) 520 reaches 90%.

That is, in this process of S5090 to S5110, if the charging rate of capacitor C(2) 520 reaches 90% before the predetermined time has elapsed since SMRG 504 was switched to the ON (conductive) state, it is determined that SMRG 504 has been normal, whereas if the charging rate of capacitor C(2) 520 does not reach 90% even when the predetermined time has elapsed since SMRG 504 was switched to the ON (conductive) state, it is determined that SMRG 504 has been immobile.

In S5120, ECU 400 switches SMRG 504 from the ON (conductive) state to the OFF (non-conductive) state. At this point, SMRB 506 remains in the ON (conductive) state.

In S5130, ECU 400 switches A-SMRB 506A and A-SMRG 504A from the OFF (non-conductive) state to the ON (conductive) state. This causes electric power to be supplied from running battery 220A through the main relay to the inverter serving as a load.

In S5140, ECU 400 determines whether or not a predetermined time has elapsed since A-SMRG 504A was switched to the ON (conductive) state. This is also because consideration is given to the charging time of capacitor C(2) 520. The predetermined time has elapsed since A-SMRG 504A was switched to the ON (conductive) state (YES in S5140), the process is moved to S5150. If not (NO in S5140), the process is moved to S5160.

In S5150, ECU 400 determines that A-SMRG 504A is immobile. Then, the process is moved to S5170.

In S5160, for example, based on detected voltage value VH, ECU 400 determines whether the charging rate of capacitor C(2) 520 reaches 95% or not (this 95% is also one example, and it is preferable that this 95% be appropriately changed depending on the number of SMRs for which immobility is determined). If the charging rate of capacitor C(2) 520 reaches 95% (YES in S5160), the process is moved to S5170. If not (NO in S5160), the process is returned to S5140, and A-SMRB 506A and A-SMRG 504A are maintained in the ON (conductive) state until the predetermined time has elapsed and until the charging rate of capacitor C(2) 520 reaches 95%.

That is, in this process of S5140 to S5160, if the charging rate of capacitor C(2) 520 reaches 95% before the predetermined time has elapsed since A-SMRG 504A was switched to the ON (conductive) state, it is determined that A-SMRG 504A has been normal, whereas if the charging rate of capacitor C(2) 520 does not reach 95% even when the predetermined time has elapsed since A-SMRG 504A was switched to the ON (conductive) state, it is determined that A-SMRG 504A has been immobile.

In S5170, ECU 400 switches A-SMRG 504A from the ON (conductive) state to the OFF (non-conductive) state. At this point, A-SMRB 506A remains in the ON (conductive) state.

In S5180, ECU 400 switches B-SMRB S0613 and B-SMRG 504B from the OFF (non-conductive) state to the ON (conductive) state. This causes electric power to be supplied from running battery 220B through the main relay to the inverter serving as the load.

In S5190, ECU 400 determines whether or not a predetermined time has elapsed since B-SMRG S0413 was switched to the ON (conductive) state. This is also because consideration is given to the charging time of capacitor C(2) 520. The predetermined time has elapsed since B-SMRG S0413 was switched to the ON (conductive) state (YES in S5190), the process is moved to S5200. If not (NO in S5190), the process is moved to S5210.

In S5200, ECU 400 determines that B-SMRG 504B is immobile. Then, the process is finished. Note that after this process in S5200, if at least one SMRG among all SRMG is determined to be not immobile, the process may be moved to S5230.

In S5210, for example, based on detected voltage value VH, ECU 400 determines whether the charging rate of capacitor C(2) 520 reaches 100% or not. If the charging rate of capacitor C(2) 520 reaches 100% (YES in S5210), the process is moved to S5220. If not (NO in S5210), the process is returned to S5190, and B-SMRB S0613 and B-SMRG 504B are maintained in the ON (conductive) state until the predetermined time has elapsed and until the charging rate of capacitor C(2) 520 reaches 100%.

That is, in this process of S5190 to S5210, if the charging rate of capacitor C(2) 520 reaches 100% before the predetermined time has elapsed since B-SMRG 504B was switched to the ON (conductive) state, it is determined that B-SMRG S0413 has been normal, whereas if the charging rate of capacitor C(2) 520 does not reach 100% even when the predetermined time has elapsed since B-SMRG 504 was switched to the ON (conductive) state, it is determined that B-SMRG 504B has been immobile.

In S5220, ECU 400 switches B-SMRG 504B from the ON (conductive) state to the OFF (non-conductive) state. At this point, B-SMRB 506B remains in the ON (conductive) state.

In S5230, ECU 400 switches the normal, negative main relay (a normal SMRG among all SMRGs) from the OFF (non-conductive) state to the ON (conductive) state. This enables a limp-home operation to be performed if at least one of a plurality of (here, three) power supply circuits (groups of running batteries and SMRs) can be used.

As described above, in a control device in the present embodiment, a failure of an SMR in a plurality of power supply circuits can be accurately detected for a short time. In particular, the amount of electric power supply until capacitor C(2) is fully charged after precharging using an SMRP is divided into multiple stages, and the connection and disconnection of the SMRs of each power supply circuit is time-divided, thereby sequentially increasing the charging rate. Thus, failure determination of SMRs of a plurality of power supply circuits can be performed by only one full charging of capacitor C(2) on the high voltage side without the need for discharging each time failure determination of SMRs of one power supply circuit is completed.

Note that a welding determination process for all SMRGs may be performed in S5010 of FIG. 10 such that immobility determination of SMRB 506 is performed in S5090 to S5110, immobility determination of A-SMRB 506A is performed in S5140 to S5160, and immobility determination of B-SMRB 506B is performed in S5190 to S5210. That is, immobility determination of the main relays (SMRBs on the positive electrode side and SMRGs on the negative electrode side) is enabled except for SMRPs connected in series to limiting resistors.

Third Embodiment

In a control device in the present embodiment, the amount of electric power supply up to full charging and to such a level (a charging rate of 80%) that capacitor C(2) on the high voltage side is fully charged and a failure of a power supply circuit (fixation of an SMR) does not occur is divided in multiple stages (how much the amount of electric power supply is divided depends on the number of power supply circuits for which failure determination is performed), and the connection and disconnection of an SMRP for precharging of each power supply circuit is time-divided, thereby sequentially increasing the charging rate. Thus, failure determination of SMRPs of a plurality of power supply circuits can be performed by only one full charging of capacitor C(2) on the high voltage side without the need for discharging each time failure determination of SMRs of one power supply circuit is completed.

That is, a precharge process of S5020 to S5060 of FIG. 10 is performed using three power supply circuits.

In more detail, if it is determined that a precharge process is started, an SMRB welding determination process is performed (here, assuming that all SMRBs are normal), SMRP 500 and SMRB 506 are switched from the OFF (non-conductive) state to the ON (conductive) state, and precharging of capacitor C(2) is started with electric power supplied from running battery 220. ECU 400 determines, based on detected voltage value VH, whether the charging rate of capacitor C(2) 520 reaches 20% or not (this 20% is one example, depending on the number of SMRPs for which immobility is determined), before a predetermined time has elapsed since SMRP 500 and SMRB 506 were switched to the ON (conductive) state. If the charging rate of capacitor C(2) 520 reaches 20%, it is determined that a precharge process by using a first power supply circuit is completed, and the process is moved to the following precharge process by using the following power supply circuit. On the other hand, if the charging rate of capacitor C(2) 520 does not reach 20% even when a predetermined time has elapsed since SMRP 500 and SMRB 506 were switched to the ON (conductive) state, ECU 400 determines, based on detected voltage value VH, that SMRP 500 is immobile.

Next, SMRP 500 and SMRB 506 are switched from the ON (conductive) state to the OFF (non-conductive) state, A-SMRP 500A and A-SMRB 506A are switched from the OFF (non-conductive) state to the ON (conductive) state, and precharging of capacitor C(2) is started with electric power supplied from running battery 220A. ECU 400 determines, based on detected voltage value VH, whether the charging rate of capacitor C(2) 520 reaches 40% or not (this 40% is also one example, depending on the number of SMRPs for which immobility is determined) before a predetermined time has elapsed since A-SMRP 500A and A-SMRB 506A were switched to the ON (conductive) state. If the charging rate of capacitor C(2) 520 reaches 40%, it is determined that a precharge process by using a second power supply circuit is completed, and the process is moved to the following precharge process by using the following power supply circuit. On the other hand, if the charging rate of capacitor C(2) 520 does not reach 40% even when a predetermined time has elapsed since A-SMRP 500A and A-SMRB 506A were switched to the ON (conductive) state, ECU 400 determines, based on detected voltage value VH, that A-SMRP 500A is immobile.

Next, A-SMRP 500A and A-SMRB 506A are switched from the ON (conductive) state to the OFF (non-conductive) state, B-SMRP 500B and B-SMRB 506B are switched from the OFF (non-conductive) state to the ON (conductive) state, and precharging of capacitor C(2) is started with electric power supplied from running battery 220B. ECU 400 determines, based on detected voltage value VH, whether the charging rate of capacitor C(2) 520 reaches 80% or not (this 80% is also one example, and may be appropriately changed so as to depend on the number of SMRs for which immobility is determined and to represent the value of precharging (an SMRG is not welded even when electric power is supplied not through a limiting resistor)), before a predetermined time has elapsed since B-SMRP 500B and B-SMRB 506B were switched to the ON (conductive) state. If the charging rate of capacitor C(2) 520 reaches 80%, it is determined that a precharge process by using a third power supply circuit is completed. On the other hand, if the charging rate of capacitor C(2) 520 does not reach 80% even when a predetermined time has elapsed since B-SMRP 500B and B-SMRB 506B were switched to the ON (conductive) state, ECU 400 determines, based on detected voltage value VH, that B-SMRP 500B is immobile.

Note that after it is determined to start a precharge process, it is also possible that a welding determination process for all SMRBs is first performed, and then immobility determination is sequentially performed for SMRPs. That is, immobility detection of SMRPs connected in series to limiting resistors is enabled.

The embodiment disclosed herein is to be considered in all respects as illustrative and not restrictive. The scope of the present invention is indicated by the appended claims rather than by the foregoing description, and all changes that come within the meaning and range of equivalency of the claims are intended to be embraced therein.

The invention claimed is:

1. A control device for a plurality of power supply circuits composed of power storage mechanisms and a plurality of relays, each of said power supply circuits including a circuit that has a first relay controlling electric conduction/non conduction between a load and one electrode of the power storage mechanism and a resistor connected in series to said first relay, a second relay connected in parallel to said circuit, and a third relay controlling electric conduction/non-conduction between the load and another electrode of the power storage mechanism, said control device comprising:
a voltage detection unit detecting a voltage value of said load;
a voltage detection unit detecting a voltage value of each of said power storage mechanisms;
a processing unit performing a precharge process upon power supply startup, the precharge process being performed by causing a conductive state of said first relay and said third relay before causing the conductive state of said second relay and said third relay in each of said power supply circuits; and a detection unit detecting immobility of any of said first relay and said third relay in any of said plurality of power supply circuits, based on a voltage value of the load, detected during said precharge process, and identifying the power supply circuit in which any of said first relay and said third relay is immobile, based on a voltage value of each of the power storage mechanisms detected during said precharge process.

2. The control device according to claim 1, wherein based on a voltage value of the load and a voltage value of each of the power storage mechanisms, said detection unit detects immobility of said third relay in any power supply circuit of said plurality of power supply circuits.

3. The control device according to claim 2, wherein said detection unit detects immobility of the third relay of every power supply circuit when said detected voltage value of the load is not higher than a voltage value determined in advance.

4. The control device according to claim 2, wherein said detection unit detects immobility of the third relay of the power supply circuit in which said detected voltage value of the load is higher than a voltage value determined in advance and the voltage value of the power storage mechanism is not higher than a voltage value separately determined in advance.

\* \* \* \* \*